(12) United States Patent
Lee et al.

(10) Patent No.: US 12,672,375 B2
(45) Date of Patent: Jun. 30, 2026

(54) IMAGE SENSOR INCLUDING AUTO-FOCUS PIXELS

(71) Applicant: SAMSUNG ELECTRONICS CO., LTD., Suwon-si (KR)

(72) Inventors: Taesung Lee, Hwaseong-si (KR); Dongmin Keum, Daegu (KR); Bumsuk Kim, Hwaseong-si (KR); Jinho Kim, Seoul (KR); Junsung Park, Hwaseong-si (KR); Kwanghee Lee, Hwaseong-si (KR); Dongkyu Lee, Suwon-si (KR); Yunki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 18/631,933

(22) Filed: Apr. 10, 2024

(65) Prior Publication Data

US 2024/0258351 A1    Aug. 1, 2024

Related U.S. Application Data

(63) Continuation of application No. 17/507,374, filed on Oct. 21, 2021, now abandoned.

(30) Foreign Application Priority Data

Dec. 3, 2020    (KR) ........................ 10-2020-0167829

(51) Int. Cl.
| | |
|---|---|
| *H10F 39/00* | (2025.01) |
| *H04N 23/67* | (2023.01) |
| *H10F 39/18* | (2025.01) |

(52) U.S. Cl.
CPC ....... *H10F 39/8063* (2025.01); *H04N 23/672* (2023.01); *H10F 39/18* (2025.01); *H10F 39/8053* (2025.01)

(58) Field of Classification Search
None
See application file for complete search history.

(56) References Cited

U.S. PATENT DOCUMENTS

| | | | |
|---|---|---|---|
| 7,413,923 | B2 | 8/2008 | Yun |
| 8,049,289 | B2 | 11/2011 | Park |
| | | (Continued) | |

FOREIGN PATENT DOCUMENTS

| | | |
|---|---|---|
| CN | 110310970 A | 10/2019 |
| KR | 10-0647283 B1 | 11/2006 |
| | (Continued) | |

OTHER PUBLICATIONS

Communication dated Jan. 17, 2025, issued by the Korean Intellectual Property Office counterpart in Korean Application No. 10-2020-0167829.

(Continued)

*Primary Examiner* — Twyler L Haskins
*Assistant Examiner* — Wesley J Chiu
(74) *Attorney, Agent, or Firm* — Sughrue Mion, PLLC

(57) ABSTRACT

An image sensor includes a normal pixel, a first auto-focus (AF) pixel, and a second AF pixel, each of the normal pixel, the first AF pixel and the second AF pixel including a photodiode. The image sensor further includes a normal microlens disposed on the normal pixel, and a first AF microlens disposed on the first AF pixel and the second AF pixel. The photodiode of the normal pixel, the photodiode of the first AF pixel, and the photodiode of the second AF pixel are respectively disposed in photo-detecting areas of a semiconductor substrate. A height of the first AF microlens in a vertical direction from a top surface of the semiconductor substrate is greater than a height of the normal microlens in the vertical direction from the top surface of the semiconductor substrate.

20 Claims, 18 Drawing Sheets

(56) References Cited

U.S. PATENT DOCUMENTS

| | | | |
|---|---|---|---|
| 8,119,437 B2 | 2/2012 | Kim et al. | |
| 9,818,781 B2 | 11/2017 | Lee et al. | |
| 10,002,899 B2 | 6/2018 | Chou et al. | |
| 10,484,627 B2 | 11/2019 | Zhou | |
| 10,547,800 B2 | 1/2020 | Hwang et al. | |
| 2005/0281942 A1 | 12/2005 | Park et al. | |
| 2007/0057338 A1 | 3/2007 | Lee et al. | |
| 2008/0073735 A1* | 3/2008 | Hwang | H10F 39/8063 |
| | | | 257/E21.243 |
| 2008/0311691 A1* | 12/2008 | Baek | H10F 39/8063 |
| | | | 257/E31.127 |
| 2009/0146235 A1* | 6/2009 | Kawasaki | H04N 23/00 |
| | | | 257/E31.127 |
| 2009/0280596 A1* | 11/2009 | Akiyama | H10F 39/199 |
| | | | 257/E31.127 |
| 2011/0018080 A1 | 1/2011 | Ootake | |
| 2016/0013231 A1 | 1/2016 | Lee | |
| 2016/0043119 A1* | 2/2016 | Lee | H10F 39/182 |
| | | | 257/446 |
| 2016/0204142 A1* | 7/2016 | Um | H10F 39/807 |
| | | | 257/446 |
| 2016/0358963 A1 | 12/2016 | Kikuchi | |
| 2017/0084655 A1* | 3/2017 | Shibuta | H04N 25/134 |
| 2017/0366770 A1 | 12/2017 | Yokogawa et al. | |
| 2018/0026065 A1* | 1/2018 | Hsieh | H10F 39/8063 |
| | | | 257/432 |
| 2018/0102389 A1* | 4/2018 | Lee | H10F 39/807 |
| 2018/0343404 A1 | 11/2018 | Hwang et al. | |
| 2019/0074399 A1 | 3/2019 | Masuda | |
| 2019/0132506 A1* | 5/2019 | Cheng | H04N 25/703 |
| 2019/0214422 A1 | 7/2019 | Shibuta | |
| 2019/0339422 A1 | 11/2019 | Lu et al. | |
| 2019/0394389 A1 | 12/2019 | Lu et al. | |
| 2021/0120198 A1* | 4/2021 | Kim | H10F 39/8053 |

FOREIGN PATENT DOCUMENTS

| | | |
|---|---|---|
| KR | 10-0649031 B1 | 11/2006 |
| KR | 10-0698072 B1 | 3/2007 |
| KR | 10-2010-0007562 A | 1/2010 |
| KR | 10-2010-0028372 A | 3/2010 |
| KR | 10-2010-0057993 A | 6/2010 |
| KR | 10-2016-0008385 A | 1/2016 |
| KR | 10-2016-0016325 A | 2/2016 |
| KR | 10-2018-0128802 A | 12/2018 |
| KR | 10-2005-0120404 A | 12/2025 |

OTHER PUBLICATIONS

Communication issued Aug. 20, 2025 by the Korean Intellectual Property Office in counterpart Korean Patent Application No. 10-2020-0167829.

"Image Sensor Subscription Channel, Year 6 Annual Onsite Presentation," Tech Insights, Oct. 19, 2018, Total 148 pages.

* cited by examiner

LP
DL2
IL
BB
DTI
FF

GF
GF
GF
BF

PDA
PDA
PDA
PDA

NPX
AFPX2
AFPX1
NPX

DTI

FF

MLN

GF

MLAF

GF

GF

MLN

BF

PDA

PDA

PDA

PDA

NPX

AFPX2

AFPX1

NPX

Y

X

IMAGE SENSOR INCLUDING AUTO-FOCUS PIXELS

CROSS-REFERENCE TO RELATED APPLICATION

This application is a continuation application of U.S. application Ser. No. 17/507,374, filed Oct. 21, 2021, which is based on and claims priority under 35 U.S.C. § 119 to Korean Patent Application No. 10-2020-0167829, filed on Dec. 3, 2020, in the Korean Intellectual Property Office, the disclosure of which is incorporated by reference herein in its entirety.

BACKGROUND

The inventive concept relates to an image sensor, and more particularly, to an image sensor including auto-focus (AF) pixels.

An image sensor captures an image and converts the image into an electric signal. The image sensor may be used not only in electronic devices for common uses such as a digital camera, a mobile phone camera, and a mobile camcorder, but also in cameras attached to cars, security devices, and robots. The image sensor includes a pixel array, and each pixel in the pixel array may include a photodiode. An auto-focus (AF) function is performed for the image sensor such that image capturing is accurately performed in a short time period.

SUMMARY

The inventive concept provides an image sensor capable of simultaneously optimizing the performances of normal pixels and auto-focus (AF) pixels.

According to an aspect of the inventive concept, there is provided an image sensor including a normal pixel, a first auto-focus (AF) pixel, and a second AF pixel, each of the normal pixel, the first AF pixel and the second AF pixel including a photodiode. The image sensor further includes a normal microlens disposed on the normal pixel, and a first AF microlens disposed on the first AF pixel and the second AF pixel. The photodiode of the normal pixel, the photodiode of the first AF pixel, and the photodiode of the second AF pixel are respectively disposed in photo-detecting areas of a semiconductor substrate. A height of the first AF microlens in a vertical direction from a top surface of the semiconductor substrate is greater than a height of the normal microlens in the vertical direction from the top surface of semiconductor substrate.

According to another aspect of the inventive concept, there is provided an image sensor including a pixel array including a plurality of pixels arranged in a first direction and a second direction perpendicular to the first direction. The plurality of pixels includes normal pixels, a first auto-focus (AF) pixel, a second AF pixel adjacent to the first AF pixel in the first direction. The image sensor further includes a first AF microlens disposed on the first AF pixel and the second AF pixel, and normal microlenses respectively disposed on the normal pixels. A vertical height of the first AF microlens is greater than a vertical height of the normal microlenses.

According to another aspect of the inventive concept, there is provided an image sensor including photo-detecting areas, in which photodiodes are respectively disposed, color filters disposed on the photo-detecting areas, and a normal microlens and an auto-focus (AF) microlens that are disposed on the color filters. The normal microlens corresponds to one among the photo-detecting areas. The AF microlens corresponds to two among the photo-detecting areas. A vertical height of the AF microlens is greater than a vertical height of the normal microlens.

BRIEF DESCRIPTION OF THE DRAWINGS

Embodiments of the inventive concept will be more clearly understood from the following detailed description taken in conjunction with the accompanying drawings in which:

FIG. 4 is a cross-sectional view of the pixel array of the image sensor according to embodiments of the inventive concept;

FIGS. 7A, 7B, 7C, 7D, 7E, 7F and 7G are cross-sectional views for describing a method of manufacturing the image sensor according to embodiments of the inventive concept;

DETAILED DESCRIPTION

Hereinafter, embodiments of the inventive concept will be described in detail with reference to the accompanying drawings.

Figure 1:
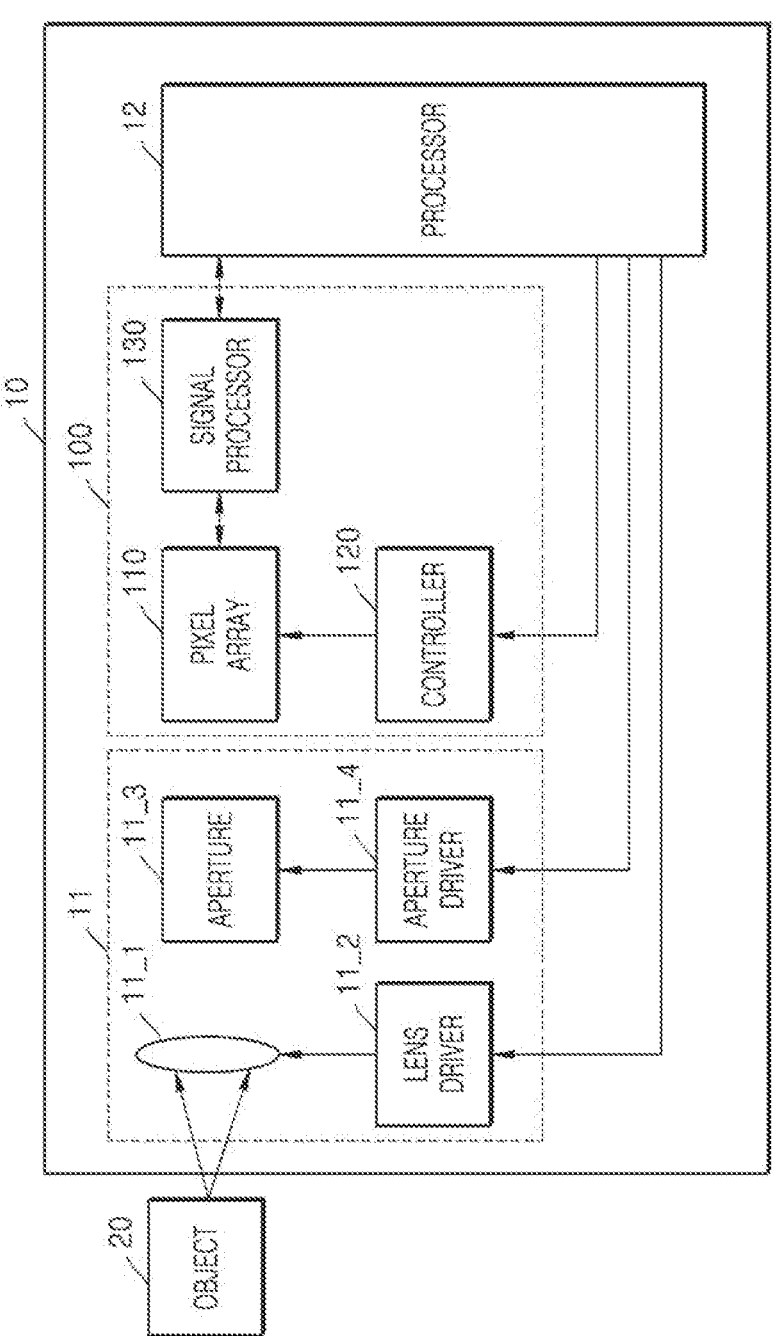
FIG. 1 is a diagram of an example structure of a digital imaging device according to embodiments of the inventive concept.

FIG. 1 is a diagram of an example structure of a digital imaging device 10 according to embodiments of the inventive concept, which describes the performance of an auto-focus (AF) function by the digital imaging device 10.

The digital imaging device 10 according to embodiments of the inventive concept may include a camera 11, an image sensor 100, and a processor 12. The digital imaging device 10 may have a focus detection function.

All operations of the digital imaging device 10 may be controlled by the processor 12. The processor 12 may provide control signals to a lens driver 11_2, an aperture driver 11_4, and a controller 120, for operations of the respective components.

As a component configured to receive light, the camera 11 may include a lens 11_1, a lens driver 11_2, an aperture 11_3, and an aperture driver 11_4. The lens 11_1 may 1 may include a plurality of lenses.

The lens driver 11_2 may exchange information regarding focus detection with the processor 12, and may adjust a position of the lens 11_1 according to the control signal provided by the processor 12. The lens driver 11_2 may shift the lens 11_1 in a direction in which a distance from an object 20 increases or decreases. By doing so, the distance between the lens 11_1 and the object 20 may be adjusted.

According to the position of the lens 11_1, a focus on the object 20 may be accurate or may be blurred.

For example, when the distance between the lens 11_1 and the object 20 is relatively small, the lens 11_1 may be out of an in-focus position, which is to adjust the focus on the object 20, and a phase difference may occur between images captured by the image sensor 100. The lens driver 11_2 may shift the lens 11_1 in a direction in which the distance from the object 20 increases, based on the control signal provided by the processor 12.

Alternatively, when the distance between the lens 11_1 and the object 20 is relatively great, the lens 11_1 may be out of the in-focus position, and a phase difference may occur between images captured by the image sensor 100. The lens driver 11_2 may shift the lens 11_1 in a direction in which the distance from the object 20 decreases, based on the control signal provided by the processor 12.

The image sensor 100 may convert incident light into to an image signal. The image sensor 100 may include a pixel array 110, the controller 120, and a signal processor 130. An optical signal transmitted through the lens 11_1 and the aperture 11_3 may form an image of a subject at a light receiving surface of the pixel array 110.

The pixel array 110 may include a complementary metal oxide semiconductor image sensor (CSI) that converts an optical signal to an electric signal. Properties such as the sensitivity of the pixel array 110 may be adjusted by the controller 120. The pixel array 110 may include a plurality of pixels that convert the optical signal into an electric signal. The plurality of pixels may each generate a pixel signal according to the intensity of sensed light.

The image sensor 100 may provide image information to the processor 12, and the processor 12 may perform a phase difference calculation by using the image information. For example, the processor 12 may perform the phase difference calculation by receiving, from the signal processor 130, image information according to a pixel signal generated in a first AF pixel and image information according to a pixel signal generated in a second AF pixel, and a result of the phase difference calculation may be acquired by performing a correlation operation on the image information. The processor 12 may acquire an in-focus position, a focus direction, or a distance between the object 20 and the image sensor 100, and the like as results of the phase difference calculation. Based on the results of the phase difference calculation, the processor 12 may output the control signal to the lens driver 11_2 to shift the position of the lens 11_1.

The processor 12 may reduce noise of an input signal and perform image signal processing for image quality improvement, for example, gamma correction, color filter array interpolation, color matrix correction, color correction, color enhancement, and the like. In addition, the processor 12 may generate an image file by performing a compression process on image data that is generated by performing an image signal process for image quality improvement, or alternatively, may restore the image data from the image file.

Figure 2:
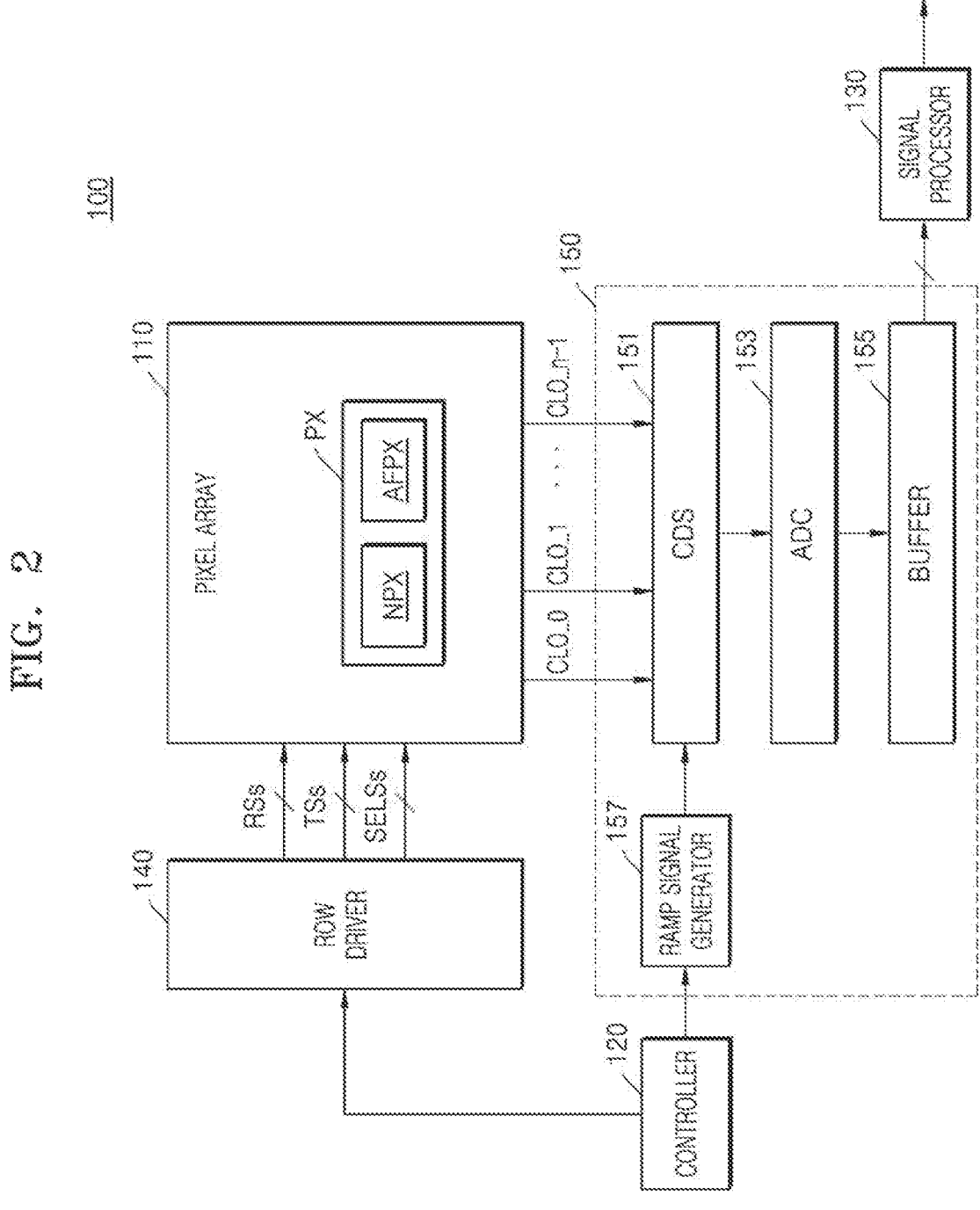
FIG. 2 is a block diagram of a configuration of an image sensor according to embodiments of the inventive concept.

FIG. 2 is a block diagram of a configuration of the image sensor 100 according to embodiments of the inventive concept.

Referring to FIG. 2, the image sensor 100 may include the pixel array 110, the controller 120, the signal processor 130, a row driver 140, and a signal read-out circuit 150. The signal read-out circuit 150 may include a correlated-double sampler (CDS) 151, an analog-digital converter (ADC) 153, and a buffer 155.

The pixel array 110 may include a plurality of pixels PXs that convert an optical signal into an electric signal. The plurality of pixels PXs may respectively generate pixel signals according to the intensity of sensed light. The plurality of pixels PXs may include a plurality of normal pixels NPX configured to perform an imaging function, and may also include a plurality of AF pixels AFPXs configured to perform an AF function or a distance measurement function. When not performing the AF function, the AF pixels AFPXs may generate a pixel signal for imaging, like the normal pixels NPXs. In this case, the AF pixels AFPXs may include a first AF pixel and a second AF pixel adjacent to each other in a first direction (e.g., the X direction shown in FIG. 4) or a second direction (e.g., the Y direction shown in FIG. 4).

In the image sensor 100 according to the inventive concept, a normal microlens formed in the normal pixel NPX may have a different shape from that of an AF microlens formed in the AF pixel AFPX. For example, a first height in a vertical direction of the AF microlens formed in the AF pixel AFPX may be greater than a second height in a vertical direction of the normal microlens formed in the normal pixel NPX. The normal microlens and the AF microlens are each formed considering a focus distance thereof, and therefore, a light receiving focus of the normal pixel NPX and a light receiving focus of the AF pixel AFPX may be respectively formed in a photo-detecting area of the normal pixel NPX and a photo-detecting area of the AF pixel AFPX. Accordingly, the performances of the normal pixel NPX and the AF pixel AFPX may be simultaneously optimized.

The normal pixels NPXs and the AF pixels AFPXs may respectively output signals to the CDS 151 through a first column output line CLO_0 to an $n^{th}$ column output line CLO_n−1, which respectively correspond to the normal pixels NPXs and the AF pixels AFPXs. According to embodiments, in an AF mode, the pixel signals output from the AF pixels AFPXs may include phase signals used to calculate phase differences. The phase signals may include information regarding positions of images formed on the image sensor 100, and an in-focus position of a lens (e.g., the lens 11_1 shown in FIG. 1) may be calculated based on the calculated phase differences. For example, a position of the lens 11_1, at which the phase difference is 0, may be the in-focus position.

The phase signals not only may have a function to focus on the object, but also may be used to measure a distance between the object (e.g., the object 20 in FIG. 1) and the image sensor 100. To measure the distance between the object 20 and the image sensor 100, additional information such as the phase differences among the images formed on the image sensor 100, a distance between the lens 11_1 and the image sensor 100, a size of the lens 11_1, the in-focus position of the lens 11_1, and the like may be referred.

The controller 120 may control the row driver 140 to drive the pixel array 110 to absorb light and accumulate an electric charge, temporarily store the accumulated electric charge, and output an electric signal according to the stored electric charge outside the pixel array 110. In addition, the controller 120 may control the signal read-out circuit 150 to measure a level of the pixel signal provided by the pixel array 110.

The row driver 140 may generate signals (i.e., reset control signals RSs, transmission control signals TSs, and selection signals SELSs) to control the pixel array 110, and may provide the signals to the plurality of pixels PXs. In embodiments, the row driver 140 may determine an activation timing and a deactivation timing of the reset control signals RSs, the transmission control signals TSs, and the selection signals SELSs that are provided to the AF pixels AFPXs to perform the AF function or the distance measurement function.

The CDS 151 may sample and hold the pixel signal provided by the pixel array 110. The CDS 151 may perform double sampling with respect to a level of noise and a level according to the pixel signal, thereby outputting levels corresponding to a difference therebetween. In addition, the CDS 151 may receive an input of ramp signals generated by a ramp signal generator 157, compare the pixel signal with the ramp signals, and output a comparison result. The ADC 153 may convert analog signals, which correspond to the levels received from the CDS 151, into digital signals. The buffer 155 may latch the digital signals, and the latched signals may be sequentially output to the signal processor 130 or to the outside of the image sensor 100.

The signal processor 130 may perform signal processing based on pixel signals output from the plurality of pixels PX. For example, the signal processor 130 may perform a noise reduction process, a gain adjustment process, a waveform shaping process, an interpolation process, a white balance process, a gamma process, an edge enhancement process, and the like. In addition, the signal processor 130 may perform the signal processing based on the phase signals, which are output from the AF pixels AFPXs during an AF operation, and may output the signal-processed information to the processor 12, thereby allowing the processor 12 to perform the phase difference calculation for the AF operation. In embodiments, the signal processor 130 may also be provided in a processor (i.e., the processor 12 shown in FIG. 1) outside the image sensor 100.

Figure 3:
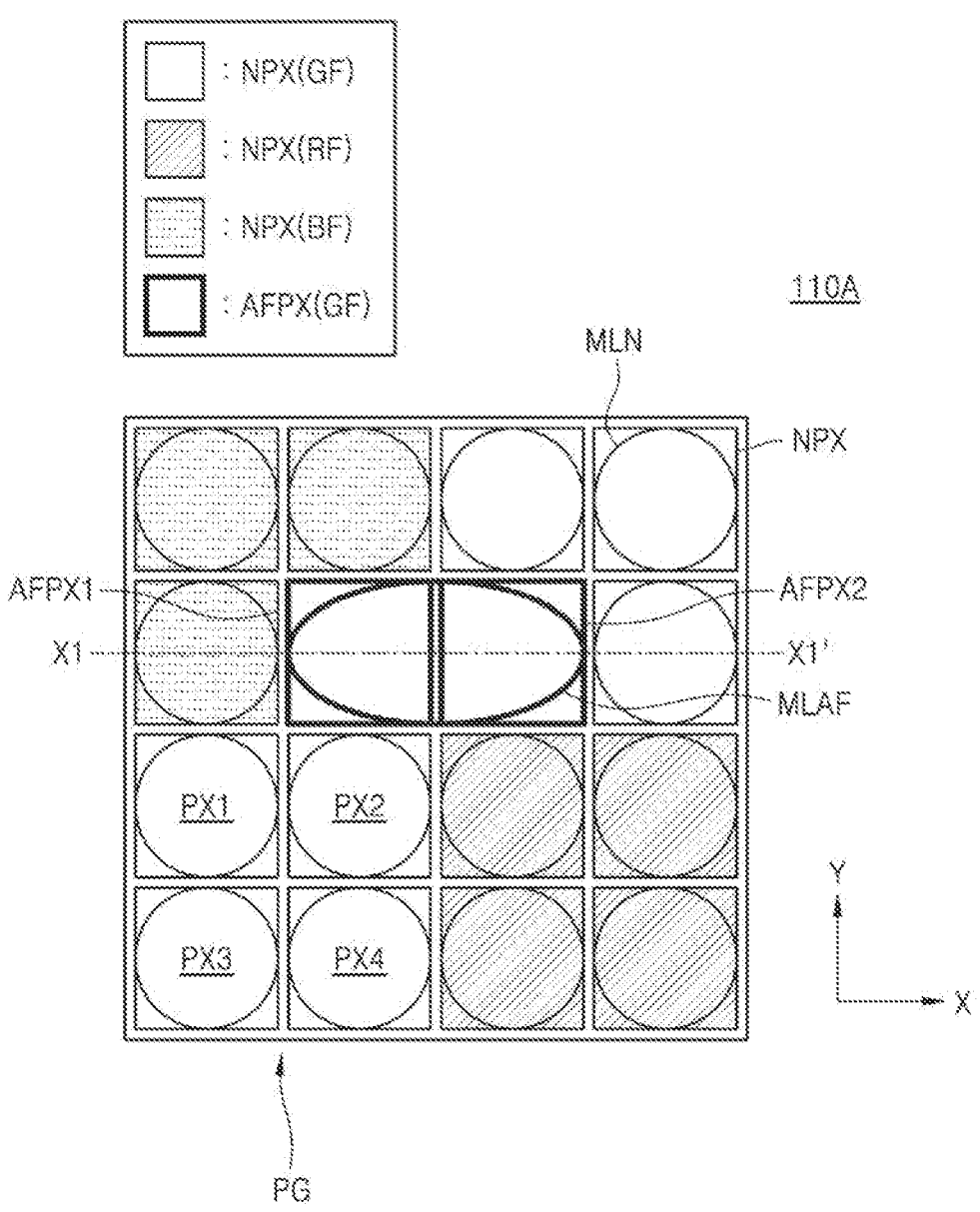
FIG. 3 is a plan view of a pixel array of the image sensor according to embodiments of the inventive concept.
Figure 4:
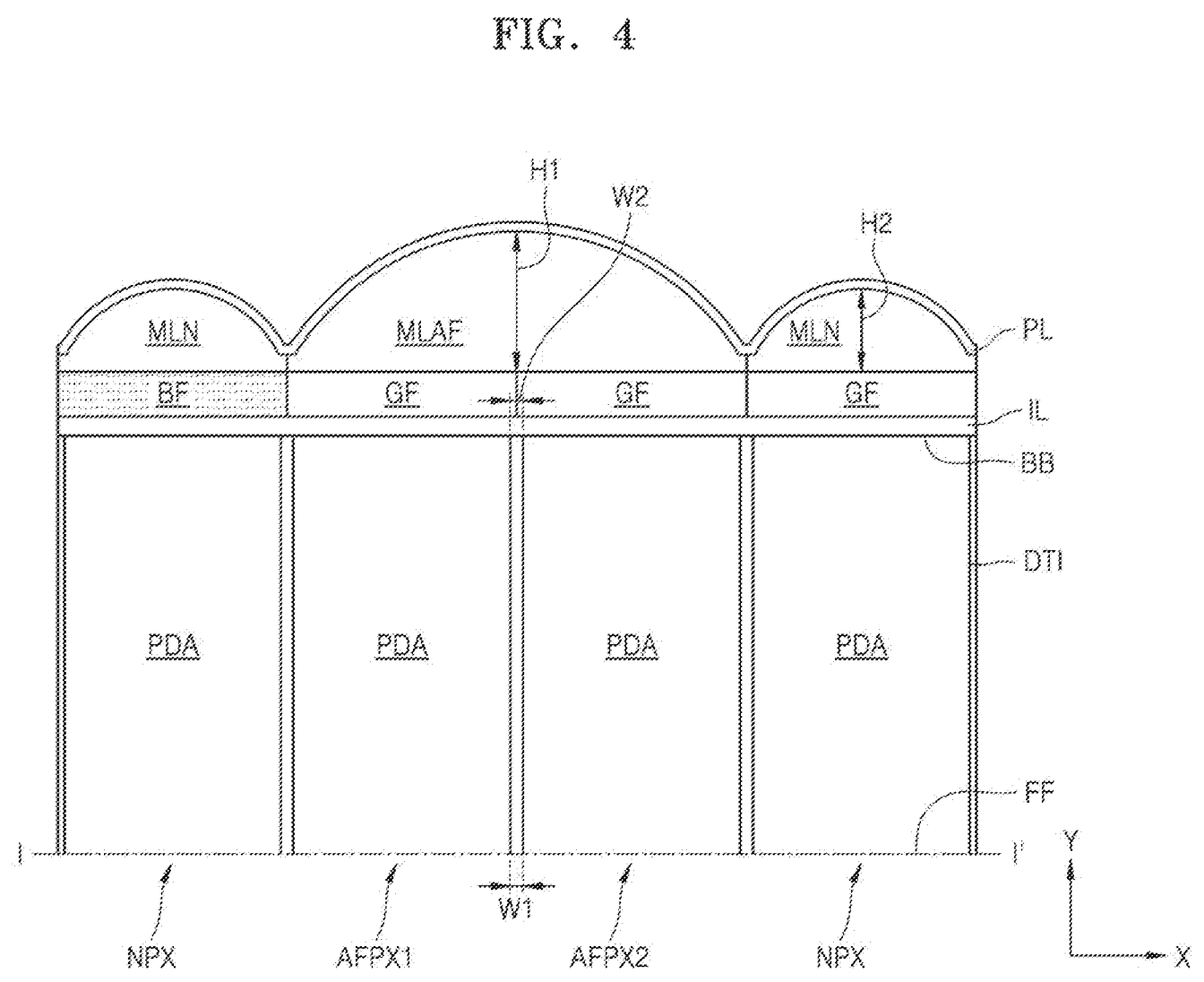

FIG. 3 is a plan view of a pixel array 110A of the image sensor 100 according to embodiments of the inventive concept, as an example of at least a portion of the pixel array 110 shown in FIG. 2. FIG. 4 is a cross-sectional view of the pixel array 110A of the image sensor 100 according to embodiments of the inventive concept, which is a cross-section taken along X1-X1' shown in FIG. 3.

Referring to FIG. 3, the pixel array 110A may include a plurality of pixels NPX, AFPX1, and AFPX2 arranged in the first direction X and the second direction Y. The first direction X and the second direction Y may be directions parallel to a semiconductor substrate on which the pixel array 110A is formed. The plurality of pixels NPX, AFPX1, and AFPX2 may include a plurality of normal pixels NPXs, and may include a first AF pixel AFPX1 and a second AFPX2, which are the AF pixels AFPXs.

In each of the plurality of normal pixels PXs, a corresponding normal microlens MLN may be formed. Accordingly, compared to an AF microlens MLAF, the normal microlens MLN may be relatively close to a circle.

The first AF pixel AFPX1 and the second AF pixel AFPX2 may be in parallel to each other in the first direction X, and an AF microlens MLAF may be formed on the first AF pixel AFPX1 and the second AF pixel AFPX2. The AF microlens MLAF may refract light, which is incident on the pixel array 110A, to a photo-detecting area PDA of each of the first AF pixel AFPX1 and the second AF pixel AFPX2.

The AF microlens MLAF may have an ellipse shape in which a width in the second direction Y is less than a width in the first direction X. As the AF microlens MLAF is formed in the first AF pixel AFPX1 and the second AF pixel AFPX2, due to a shape and a refractive index of the AF microlens MLAF, the first AF pixel AFPX1 and the second AF pixel AFPX2 may respectively output different phase signals. By using the phase signals respectively output from the first AF pixel AFPX1 and the second AF pixel AFPX2, the image sensor 100 may perform the AF function in the first direction X.

Although an example in which the first AF pixel AFPX1 and the second AF pixel AFPX2 are in parallel to each other in the first direction X is described with reference to FIG. 3, the image sensor 100 according to the inventive concept is not limited thereto, and the first AF pixel AFPX1 and the second AF pixel AFPX2 may also be in parallel to each other in the second direction Y. In this case, the AF microlens MLAF may have an ellipse shape in which the width in the second direction Y is greater than the width in the first direction X, and by using the phase signals respectively output from the first AF pixel AFPX1 and the second AF pixel AFPX2, the image sensor 100 may perform the AF function in the second direction Y.

In embodiments, the first AF pixel AFPX1 may be adjacent to the normal pixel NPX, except for the second AF pixel AFPX2. For example, the first AF pixel AFPX1 may be adjacent to the normal pixels NPXs in the second direction Y and a direction opposite the second direction Y. Furthermore, in embodiments, the second AF pixel AFPX2 may be adjacent to the normal pixels NPXs, except for the first AF pixel AFPX1. For example, the second AF pixel AFPX2 may be adjacent to the normal pixels NPXs in the second direction Y and the direction opposite the second direction Y.

In embodiments, a color filter (i.e., a blue filter BF) formed in the normal pixel NPX that is adjacent to the first AF pixel AFPX1 in the second direction Y and a color filter (i.e., a green filter GF) formed in the normal pixel NPX that is adjacent to the second AF pixel AFPX2 in the second direction Y may be different from each other. Alternatively, in embodiments, a color filter (i.e., a green filter GF) formed in the normal pixel NPX adjacent to the first AFPX pixel in the direction opposite the second direction Y and a color filter (i.e., a red filter RF) formed in the normal pixel NPX adjacent to the second AF pixel AFPX2 in the direction opposite the second direction Y may be different from each other.

Color filters may be respectively formed in the plurality of pixels NPX, AFPX1, and AFPX2 such that the plurality of pixels NPX, AFPX1, and AFPX2 may sense various colors. In embodiments, the color filters may include red filters RFs sensing red color, green filters GFs sensing green color, and blue filters BFs sensing blue color.

The normal pixels NPXs arranged in two rows adjacent to each other and two columns adjacent to each other, in which same color filters are formed, may construct one pixel group PG. For example, a first pixel PX1, a second pixel PX2, a third pixel PX3, and a fourth pixel PX4 constructing one pixel group PG may be arranged to be adjacent to one another in two rows and two columns, and same green filters GFs may be formed therein. However, this is an example, and normal pixels NPXs constructing one pixel group PG may be variously arranged.

In embodiments, the pixel groups PGs in the pixel array 110A may be arranged to correspond to a Bayer pattern. However, this is an example, and the pixel array 110A according to embodiments of the inventive concept may include various kinds of color filters. For example, the color filters may include filters configured to sense yellow, cyan, and magenta colors. Alternatively, the color filters may include a filter configured to sense white color.

Same color filters may be formed in the first AF pixel AFPX1 and the second AF pixel AFPX2 adjacent to each other. For example, green filters GFs may be formed in the first AF pixel AFPX1 and the second AF pixel AFPX2.

In embodiments, when the plurality of pixels NPXs, AFPX1s, and AFPX2s are arranged in sixteen rows and sixteen columns in the pixel array 110A, each of the first AF pixel AFPX1s and the second AF pixel AFPX2s may be arranged in four. However, this is an example, and a ratio of the first AF pixels AFPX1s and the second AF pixels AFPX2s included in the pixel array 110A may vary.

Referring to FIGS. 3 and 4, there may be provided a semiconductor substrate, on which the plurality of pixels NPXs, APFX1s, and AFPX2s are formed, and the semiconductor substrate may have a first surface FF and a second surface BB facing each other. For example, the first surface FF may be a top surface of the semiconductor substrate, and the second surface BB may be a bottom surface of the semiconductor substrate. Circuits may be on the first surface FF, and the light may incident on the second surface FF.

Photo-detecting areas PDAs may be in the semiconductor substrate. The photo-detecting areas PDAs may be isolated from one another by deep trench isolation portions DTIs, and in a plan view, may be arranged in the form of a matrix in the first direction X (a first horizontal direction) and the second direction Y (a second horizontal direction). The first and second horizontal directions may be parallel to the second surface BB of the semiconductor substrate. The photo-detecting areas PDAs may respectively correspond to the plurality of pixels NPXs, AFPX1s, and AFPX2s, and photodiodes respectively included in the plurality of pixels NPXs, AFPX1s, and AFPX2 may be formed in the photo-detecting areas PDAs.

The deep trench isolation portions DTIs may be formed in the semiconductor substrate. In embodiments, the deep trench isolation portions DTIs may be formed to extend from the first surface FF of the semiconductor substrate to the second surface BB thereof. For example, a first width W1 in a cross-section in which the deep trench isolation portion DTI contacts the first surface FF may be greater than a second width W2 in a cross-section in which the deep trench isolation portion DTI contacts the second surface BB. Alternatively, in embodiments, the deep trench isolation portion DTI may be formed to extend in a direction opposite the vertical direction Z from the second surface BB of the semiconductor substrate to the first surface FF thereof, and the first width W1 may be less than the second width W2. Shapes and manufacturing processes of the deep trench isolation portion DTI may be variously configured.

The deep trench isolation portion DTI may include an insulating material having a refractive index that is lower than that of the semiconductor substrate. For example, the deep trench isolation portion DTI may include silicon oxide, silicon nitride, undoped polysilicon, air, or combinations thereof. The deep trench isolation portion DTI may refract incident light incident on each of the photo-detecting areas PDAs.

An insulating layer IL and the color filters (i.e., the green color filters GFs, the red color filters RFs, and the blue color filters BFs) may be on the second surface BB of the semiconductor substrate, and one of the normal microlens MLN and the AF microlens MLAF may be on the green color filters GFs, red color filters RFs, and blue color filters BFs. The normal microlens MLN may be on the second surface BB of the semiconductor substrate on which the normal pixel NPX is formed, and the AF microlens MLAF may be on the second surface BB of the semiconductor substrate on which the first AF pixel AFPX1 and the second pixel AFPX2 are formed. In embodiments, the normal microlens MLN and the AF microlens MLAF may include a polymer.

In embodiments, a first height H1 of the AF microlens MLAF in a vertical direction Z may be different from a height H2 of the normal microlens MLN in the vertical direction Z. For example, the first height H1 of the AF microlens MLAF may be greater than the second height H2 of the normal microlens MLN.

As the normal microlens MLN is on one normal pixel NPX and the AF microlens MLAF is on two AF pixels AFPX1 and AFPX2, a shape difference in the horizontal direction between the normal microlens MLN and the AF microlens MLAF may occur. An area of the AF microlens MLAF in a horizontal direction may be greater than an area of the normal microlens MLN in the horizontal direction. Accordingly, by forming the first height H1 of the AF microlens MLAF to be greater than the second height H2 of the normal microlens MLN, the light receiving focus of the normal pixel NPX and light receiving focuses of the AF pixels AFPX1 and AFPX2 may be formed in the photo-detecting area PDA of the normal pixel NPX and the photo-detecting areas PDAs of the AF pixels AFPX1 and the AFPX2, respectively. Accordingly, the performances of the normal pixel NPX and the AF pixels AFPX1 and AFPX2 may be simultaneously optimized.

A protection layer PL may be formed on the normal microlens MLN and the AF microlens MLAF. The protection layer PL may be formed to protect the normal microlens MLN and the AF microlens MLAF, and in embodiments, the protection layer PL may include an oxide.

In embodiments, the protection layer PL may be not formed in the normal microlens MLS and the AF microlens MLAF. For example, an oxide film may be not included in each of the normal microlens MLN and the AF microlens MLAF. That is, the AF microlens MLAF may not have other layers formed therein, and may be continuously formed of a same material in a vertical direction Z.

Figure 5:
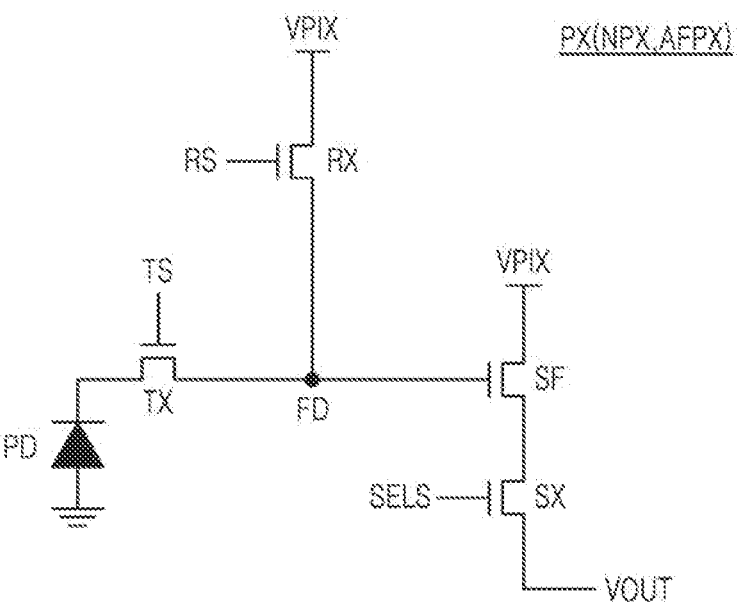
FIG. 5 is a circuit diagram of a pixel included in a pixel array according to embodiments of the inventive concept.

FIG. 5 is a circuit diagram of the pixel PX included in a pixel array according to embodiments of the inventive concept.

Referring to FIG. 5, the pixel PX (for example, one of the normal pixel NPX and the AF pixel AFPX) may include a photodiode PD, a transmission transistor TX, a selection transistor SX, a source follower SF, and a reset transistor RX. Unlike shown in FIG. 5, any one or any combination of the transmission transistor TX, the selection transistor SX, the source follower SF, and the reset transistor RX may be omitted.

The photodiode PD may generate a photocharge that changes according to the intensity of light. For example, the photodiode PD, which is a P-N junction diode, may generate a charge, that is, an electron (a negative charge) and a hole (a positive charge), in proportion to an amount of incident light. As an example of a photoelectric conversion element, the photodiode PD may include any one or any combination of a phototransistor, a photogate, and a pinned photo diode (PPD).

The transmission transistor TX may transmit the generated photocharge to a floating diffusion area FD in response to a transmission control signal (for example, one of the transmission control signals TSs in FIG. 2). When the transmission transistor TX is turned on, the photocharge generated by the photodiode PD may be transmitted to the floating diffusion area FD, and may be accumulated and stored in the floating diffusion area FD.

The reset transistor RX may periodically reset the photocharges accumulated in the floating diffusion area FD. A first terminal of the reset transistor RX may be connected to the floating diffusion area FD, and a second terminal may be connected to a power voltage VPIX. When the reset transistor RX is turned on in response to a reset control signal (for example, one of the reset control signals RSs in FIG. 2), the power voltage VPIX connected to the reset transistor RX may be delivered to the floating diffusion area FD. When the reset transistor RX is turned on, the photocharges accumulated in the floating diffusion area DF may be discharged, and the floating diffusion area FD may be reset.

The source follower may be controlled according to an amount of the photocharges accumulated in the floating diffusion area FD. The source follower SF, which is a buffer amplifier, may buffer a signal according to the charges charged in the floating diffusion area FD. The source follower SF may amplify an electric potential change in the floating diffusion area FD and output the electric potential change as a pixel signal VOUT through a column output line (for example, one of the first column output line CLO_0 through the n$^{th}$ column output line CLO_n−1).

The selection transistor SX is connected to the source follower SF, and may output the pixel signal VOUT to a CDS (for example, the CDS 151 in FIG. 2) through the first column output line CLO_0, in response to a selection signal (for example, one of the selection signals SELSs in FIG. 2).

Figure 6:
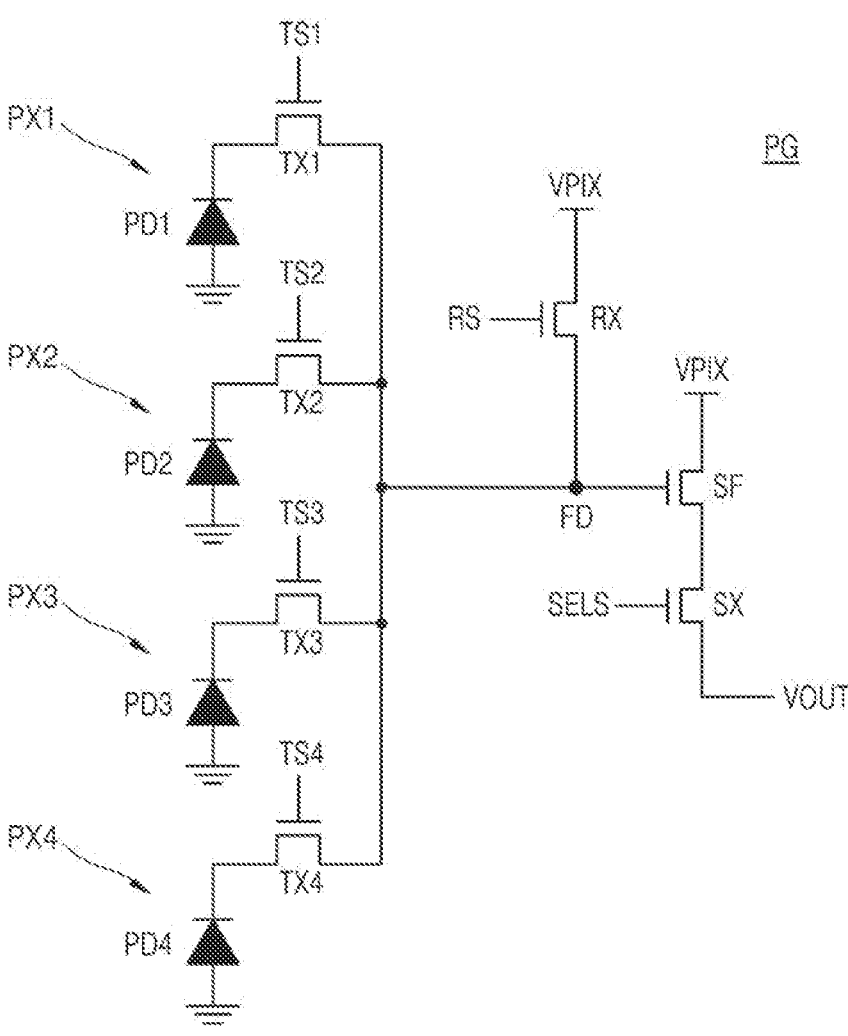
FIG. 6 is a circuit diagram of a pixel included in the image sensor according to embodiments of the inventive concept.

FIG. 6 is a circuit diagram of a pixel included in the image sensor 100 according to embodiments of the inventive concept, as an example of a pixel group included in the pixel array 110A shown in FIG. 3.

Referring to FIGS. 3 and 6, pixels with same color filters formed therein and adjacent to each other in the first direction X and the second direction Y, for example, the first pixel PX1, the second pixel PX2, the third pixel PX3, and the fourth pixel PX4 may construct a pixel group PG sharing the floating diffusion area FD. Although FIG. 3 shows the pixel group PG, for convenience of explanation, as the normal pixels NPXs including the first pixel PX1, the second pixel PX2, the third pixel PX3, and the fourth pixel PX4, in which green filters GFs are formed, a plurality of pixels sharing color filters (for example, one of the red filter RF and the blue filter BF) other than the green filters GFs may form one pixel group PG. In addition, the number of pixels included in one pixel group PG may vary, and the AF pixels AFPXs may also construct one pixel group PG.

The pixel group PG may include a plurality of photodiodes PD1 through PD4, a plurality of transmission transistors TX1 through TX4, the selection transistor SX, the source follower SF, and the reset transistor RX. In embodiments, any one or any combination of the selection transistor SX, the source follower SF, and the reset transistor RX may be omitted.

Each of the photodiodes PD1 through PD4 may generate a photocharge that changes according to the intensity of light. In response to transmission control signals (for example, the transmission control signals TSs), the transmission transistors TX1 through TX4 may each transmit the generated photocharge to the floating diffusion area FD. The generated photocharge may be accumulated and stored in the floating diffusion area FD.

Each of the pixels PX1 through PX4 constructing the pixel group PG may include a corresponding photodiode (e.g., one of the photodiodes PD1 through PD4), and may include a corresponding transmission transistor TX1 through TX4. For example, the first pixel PX1 constructing the pixel group PX1 may include the first photodiode PD1 and the first transmission transistor TX1, the second pixel PX2 may include the second photodiode PD2 and the second transmission transistor TX2, the third pixel PX3 may include the third photodiode PD3 and the third transmission transistor TX3, and the fourth pixel PX4 may include the fourth photodiode PD4 and the fourth transmission transistor TX4.

The pixels PX1 through PX4 constructing the pixel group PG may share one floating diffusion area FD. Sharing of the pixel group PG not only may include sharing one floating diffusion area FD by the plurality of photodiodes PD1 through PD4, but also may include sharing the transistors RX, SF, and SX except for the transmission transistors TX1 through TX4. Accordingly, the photocharges generated in the respective photodiodes PD1 through PD4 may be all accumulated in the shared floating diffusion area FD.

FIGS. 7A, 7B, 7C, 7D, 7E, 7F and 7G are cross-sectional views for describing a method of manufacturing the image sensor 100 according to embodiments of the inventive concept, which are diagrams corresponding to a cross-section cut along X1-X1' shown in FIG. 3. In the descriptions regarding FIGS. 7A through 7G, repeated description regarding reference numerals that are the same as those of FIGS. 3 and 4 may be omitted.

Figure 7A:
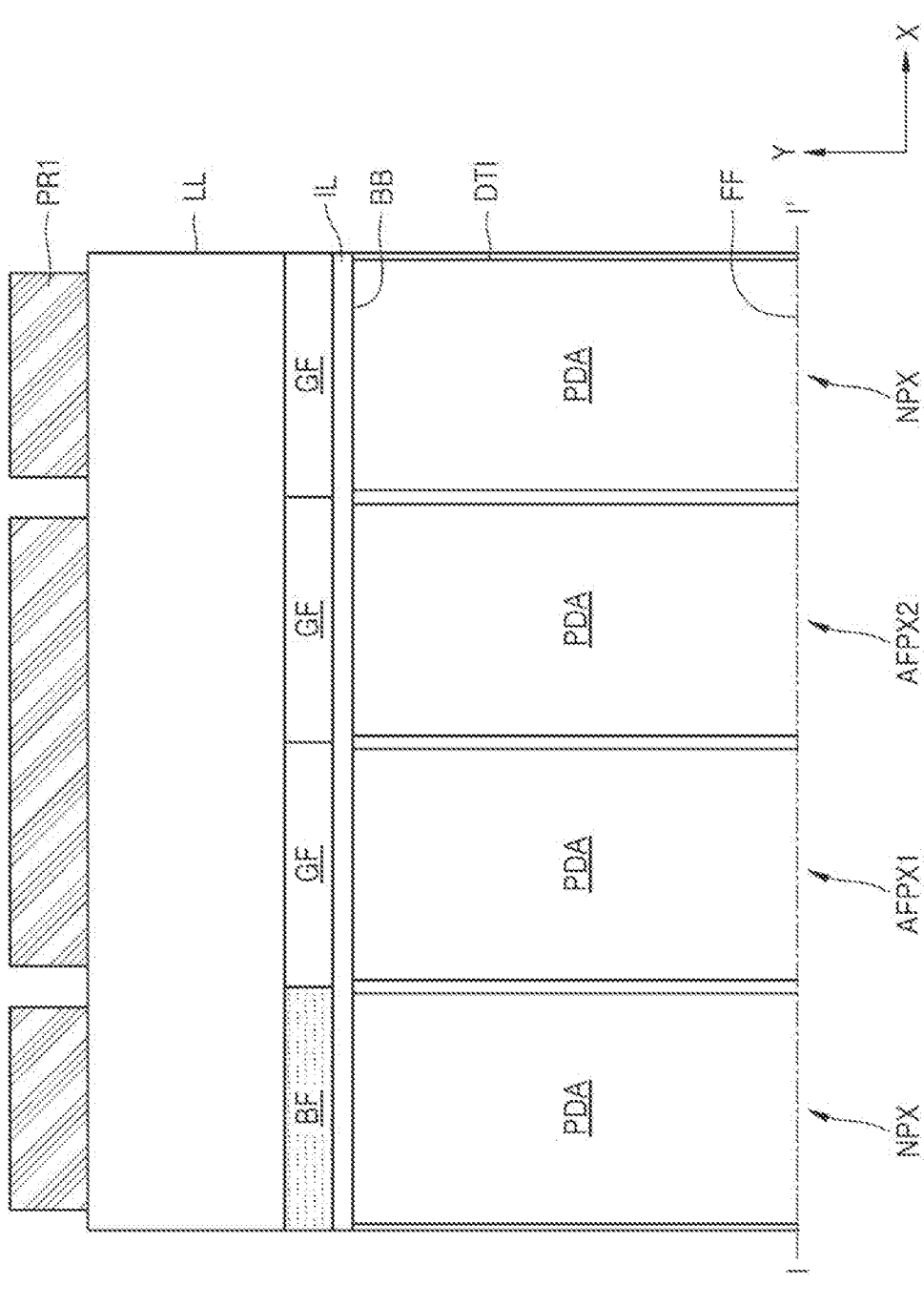

Referring to FIG. 7A, a lens layer LL may be formed on the second surface BB of the semiconductor substrate and cover top surfaces of the color filters GF and BF. In embodiments, the lens layer LL may include a polymer, and for example, the lens layer LL may be formed by a spin coating process using an organic material (e.g., a photoresist material) or a thermosetting resin.

A first photoresist film PR1 may be formed on the lens layer LL. The first photoresist film PR1 may be formed of patterns corresponding to the respective normal pixels NPXs, and the first photoresist film PR1 may be formed of one same pattern on the first AF pixel AFPX1 and the second AF pixel AFPX2. The patterns of the first photoresist film PR1 may be formed with gaps therebetween.

Figure 7B:
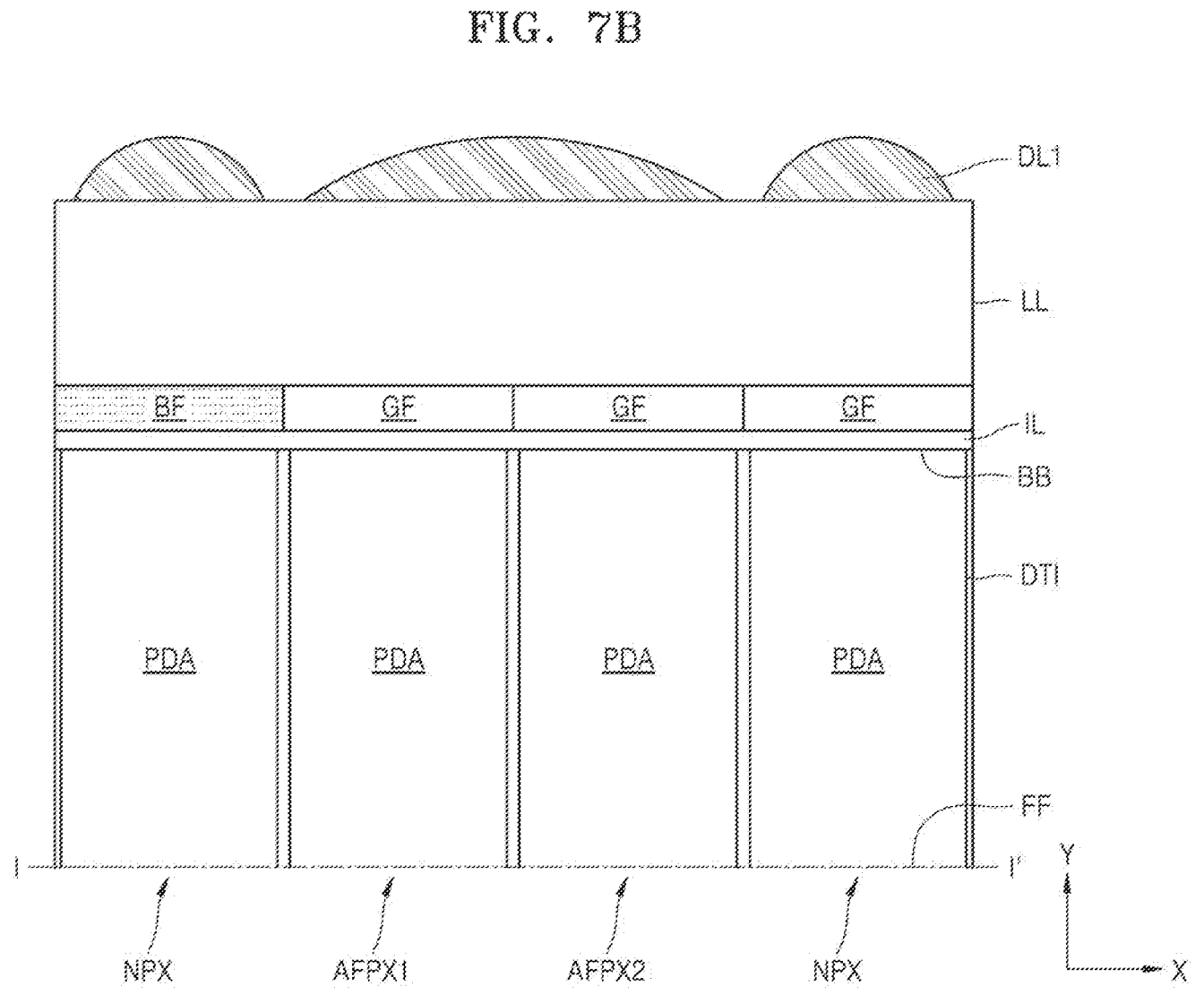

Referring to FIGS. 7A and 7B, a reflow process on the first photoresist film PR1 may be performed, and as a shape of the first photoresist film PR1 changes, first dummy lenses DL1 may be formed in a convex hemisphere shape.

Figure 7C:
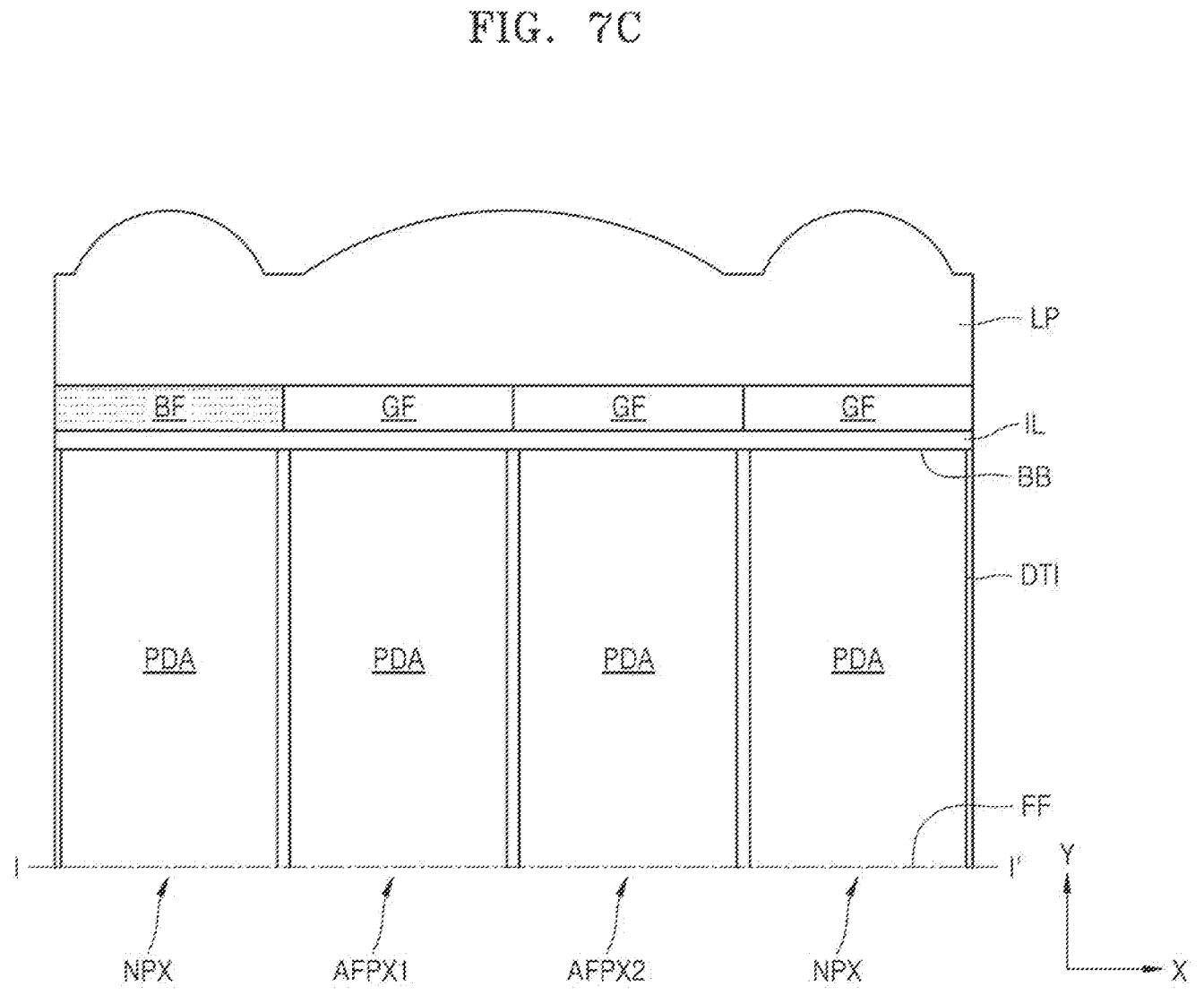

Referring to FIGS. 7B and 7C, a portion of the lens layer LL may be etched through an etching process in which the first dummy lenses DL1 as etching masks, and a microlens pattern LP may be formed. The microlens pattern LP may be formed in the lens layer LL through a transcription etching process by the first dummy lenses DL1, and may be formed through a wet etch-back process in which the first dummy lenses DL1 are used as etching masks. A wet etching process may be an etching chemical process in which the green color filters GFs, red color filters RFs, and blue color filters BFs are not damaged.

As the etching process is performed such that the shape of the first dummy lenses DL1 is transcribed to the lens layer LL, the microlens patter LP in a convex lens shape may be formed. Etching of the lens layer LL for forming the microlens pattern LP may be performed until the photoresist constructing the first dummy lenses DL1s is completely etched.

Figure 7D:
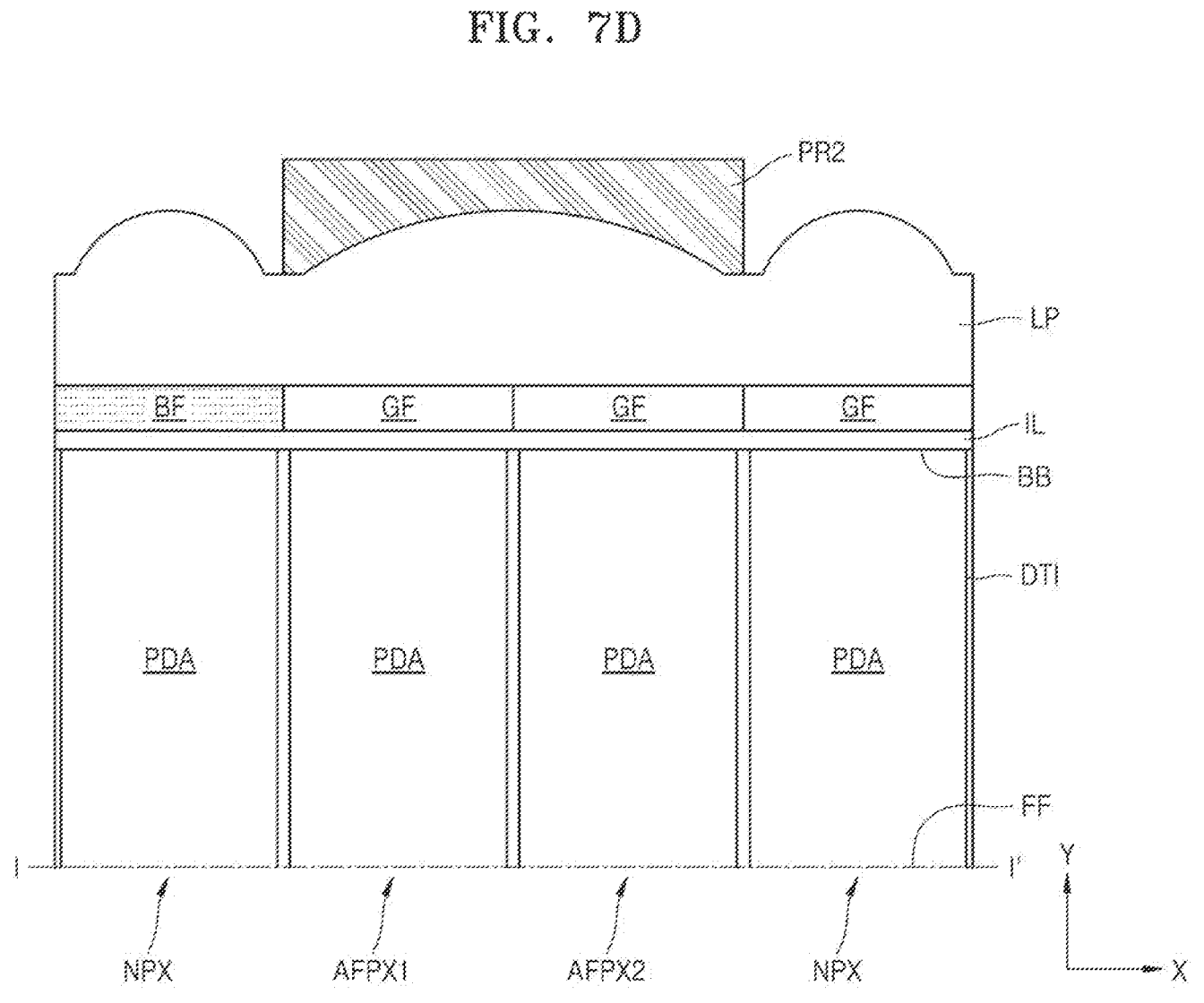

Referring to FIGS. 7C and 7D, a second photoresist film PR2 may be formed on the microlens pattern LP. The second photoresist film PR2 may be formed as a common pattern on the first AF pixel AFPX1 and the second AF pixel AFPX2. That is, the second photoresist film PR2 may be formed on the first AF pixel AFPX1 and the second AF pixel AFPX2 and may be not formed on the normal pixel NPX.

Figure 7E:
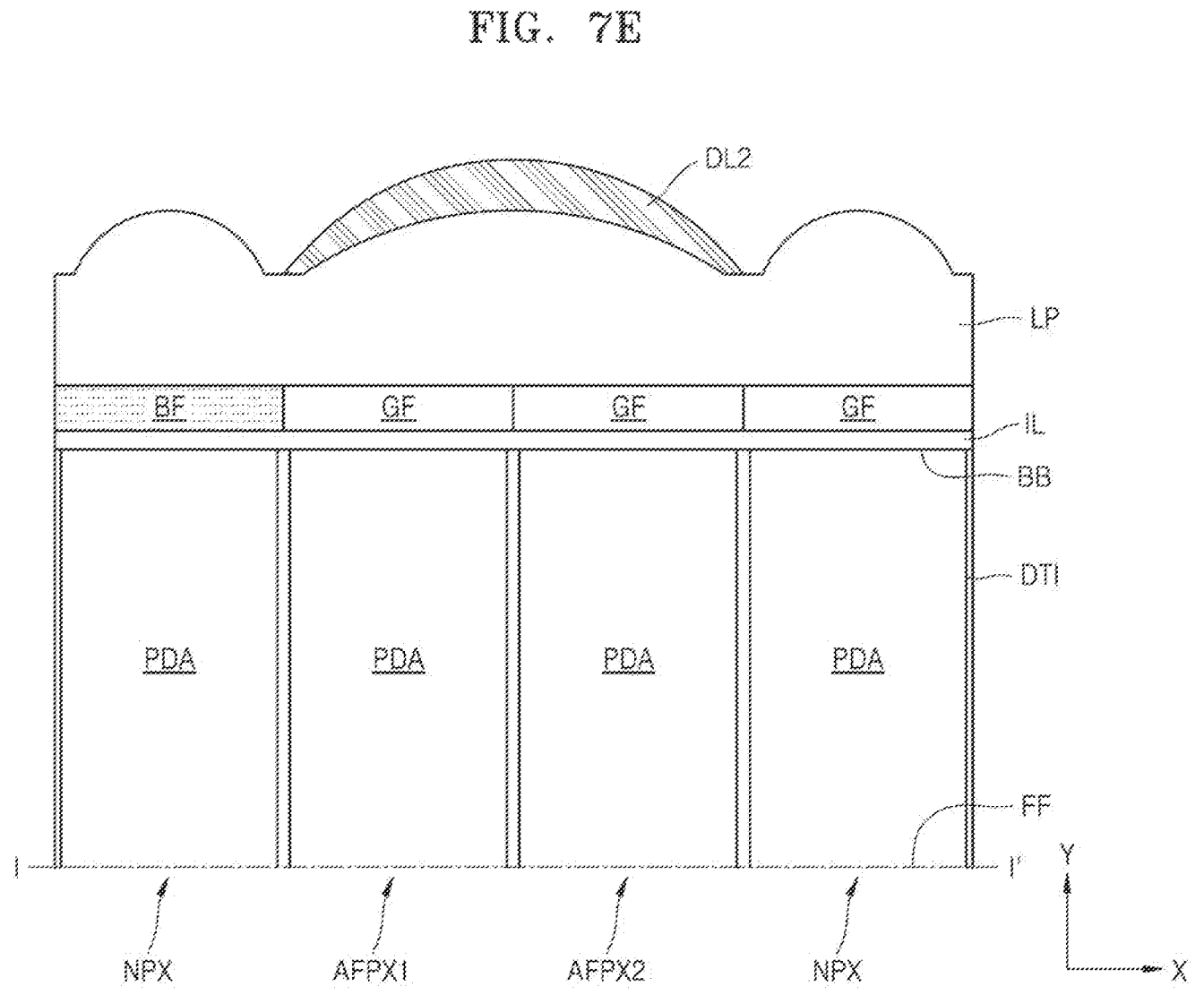

Referring to FIGS. 7D and 7E, a reflow process on the second photoresist film PR2 may be performed, and as a shape of the second photoresist film PR2 changes, second dummy lenses DL2 may be formed each in a convex hemisphere shape.

Figure 7F:
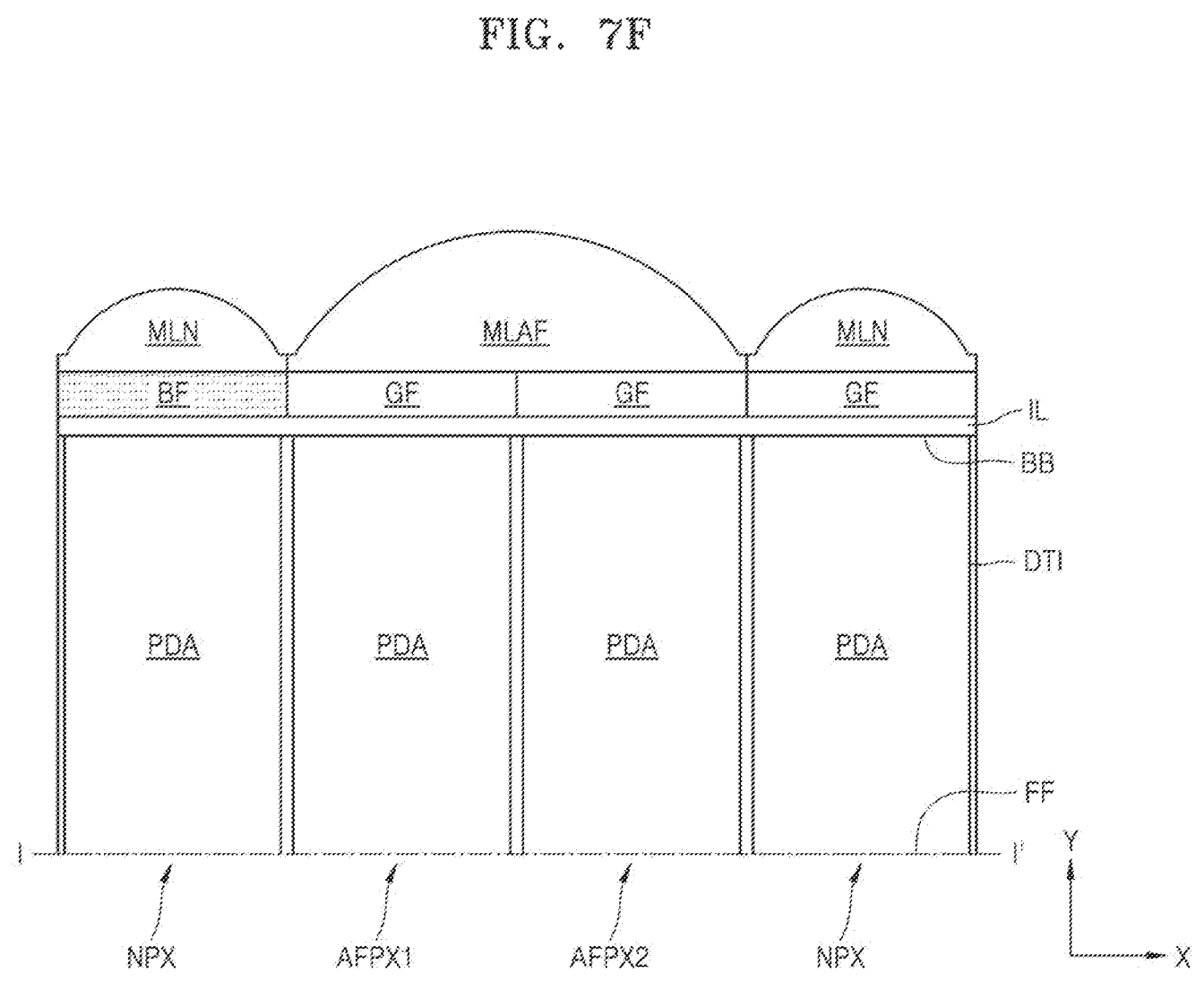

Referring to FIGS. 7E and 7F, a portion of the microlens pattern LP may be etched through an etching process in which the second dummy lenses DL2 are used as etching masks, and the normal microlens MLN and the AF microlens MLAF may be formed. The normal microlens MLN and the AF microlens MLAF may be formed through a transcription etching process by the second dummy lenses DL2 and a wet etch-back process in which the second dummy lenses DL2 are used as etching masks.

As the etching process is performed such that the shape of the second dummy lenses DL2 is transcribed on the microlens pattern LP, a first height (e.g., the first height H1 in FIG. 4) in the vertical direction Z of the AF microlens MLAF may be formed to be greater than a second height (e.g., the second height H2 in FIG. 4) in the vertical direction Z of the normal microlens MLN. Etching of the microlens pattern LP to form the normal microlens MLN and the AF microlens MLAF may be performed until a photoresist constructing the second dummy lenses DL2 is completely etched.

Figure 7G:
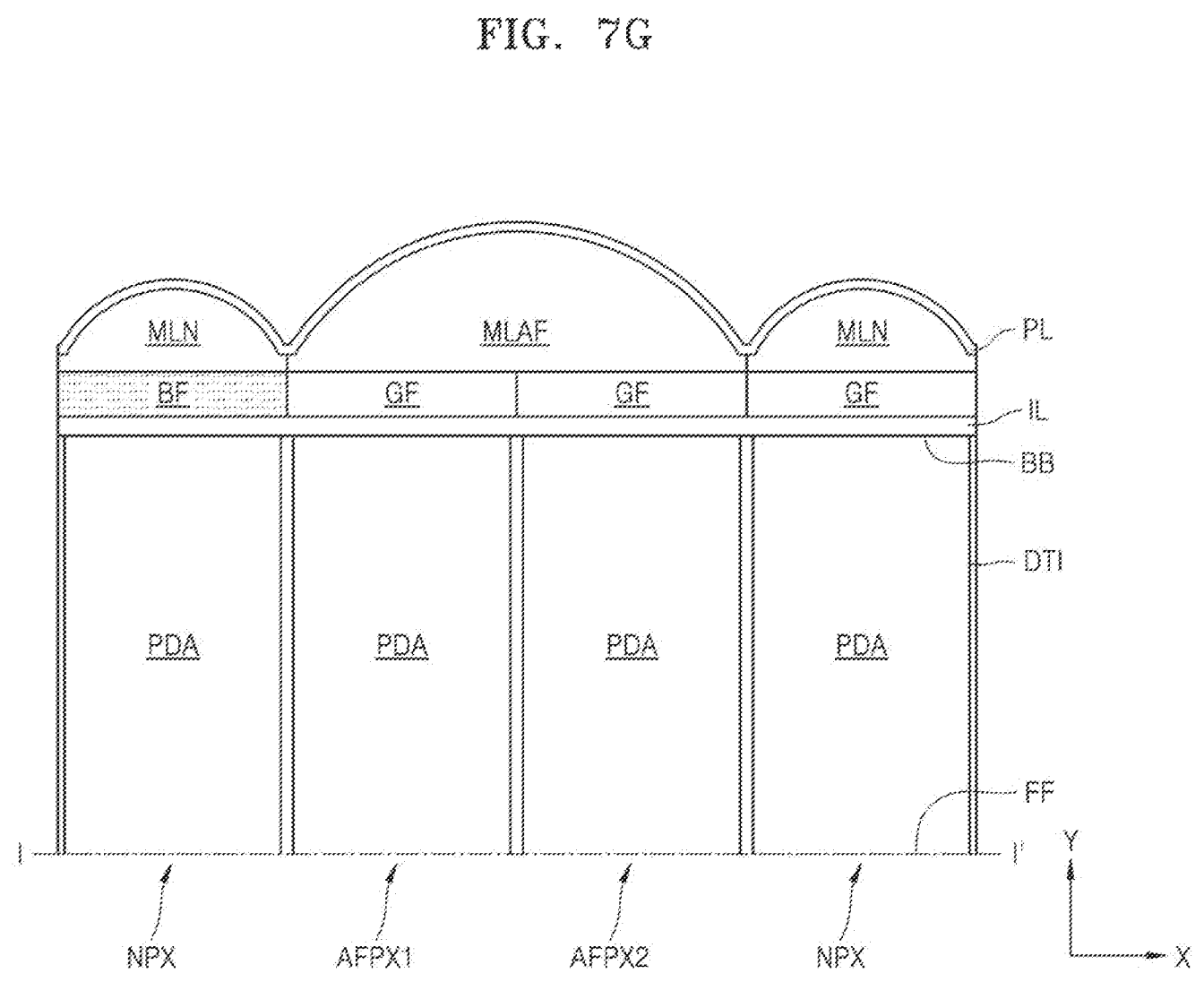

Referring to FIG. 7G, the protection layer PL may be deposited on the normal microlens MLN and the AF microlens MLAF. For example, the protection layer PL may include an oxide.

In a method of manufacturing the image sensor according to the inventive concept, a photo process may be performed twice on the lens layer LL to manufacture the normal microlens MLN and the AF microlens MLAF. A first photo process on the lens layer LL may be performed to make the shapes of the normal microlenses MLNs and the AF microlens MLAF as described with reference to FIGS. 7A through 7C, and a second photo process on the lens layer LL may be performed to make the shapes of the normal microlenses MLNs and the AF microlens MLAF as described with reference to FIGS. 7D through 7F. Accordingly, in the image sensor according to the inventive concept, vertical heights of the normal microlens MLN formed in the normal pixel NPX and the AF microlens MLAF formed in the AF pixel AFPX may be differently formed considering focal lengths. Light receiving focuses of the normal pixel NPX and the AF pixel AFPX for light incident on the image sensor may be respectively formed in the photo-detecting area PDA of the normal pixels NPXs and the photo-detecting area PDA of the AF pixel AFPX. Accordingly, the performances of the normal pixel NPX and the AF pixel AFPX may be simultaneously optimized.

Figure 8:
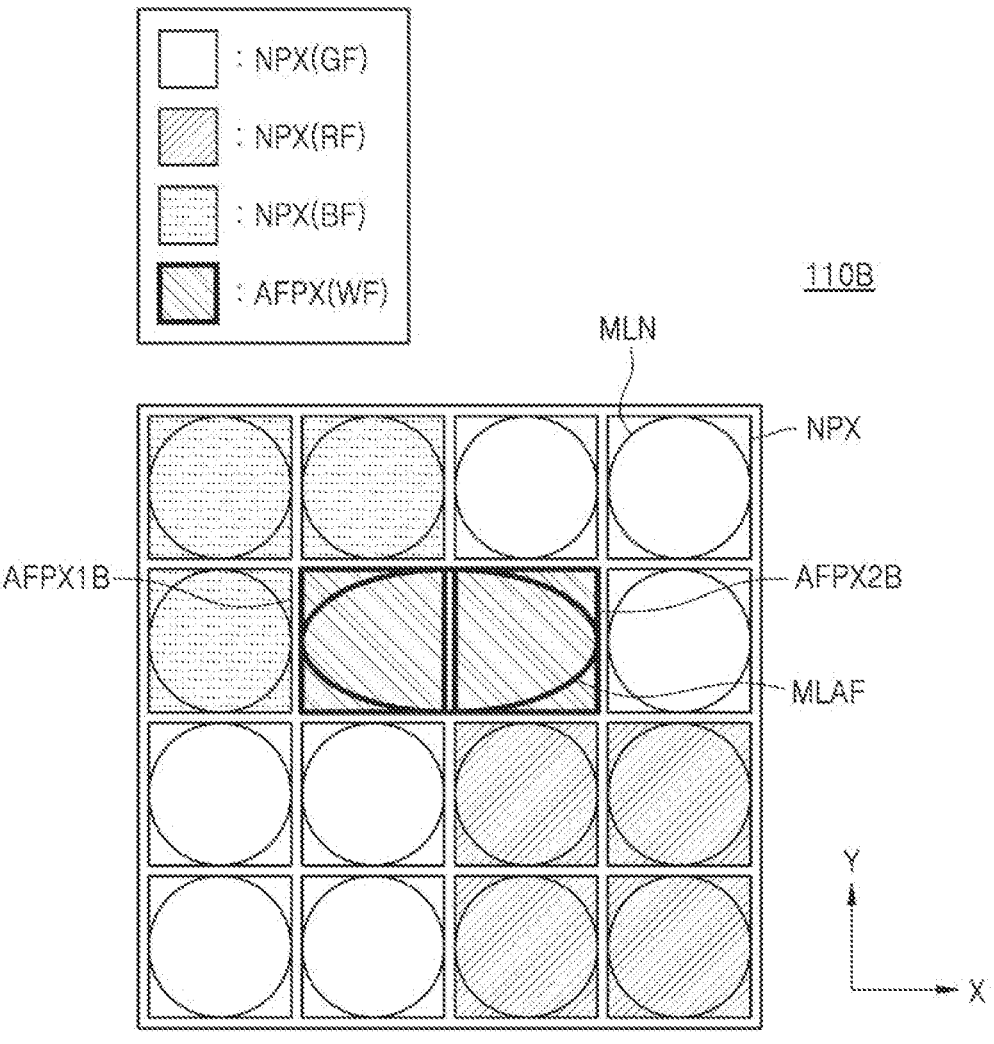
FIGS. 8 and 9 are plan views of pixel arrays of the image sensor according to embodiments of the inventive concept.
Figure 9:
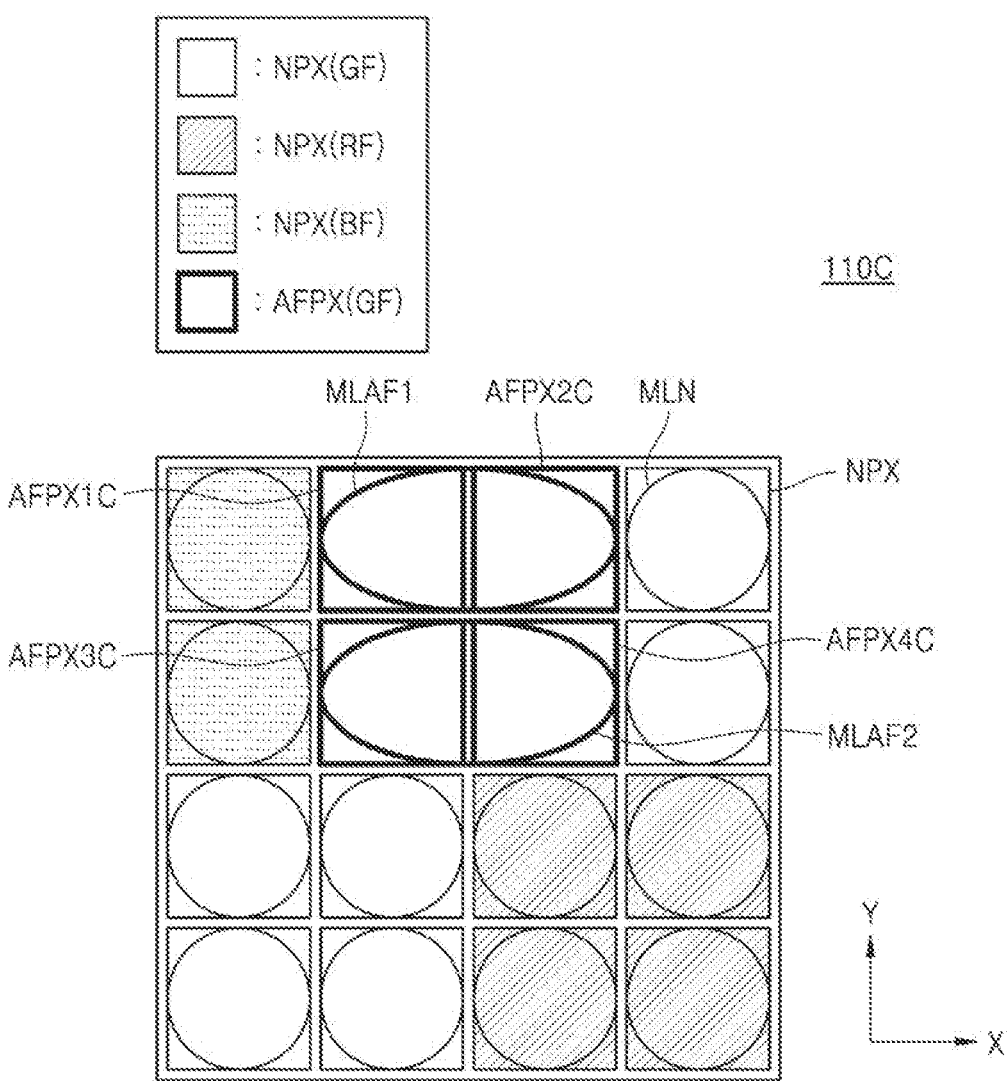

FIGS. 8 and 9 are diagrams of pixel arrays 110B and 110C of the image sensor 100 according to embodiments of the inventive concept, as examples of at least a portion of the pixel array 110 shown in FIG. 2. In the descriptions regarding FIGS. 8 and 9, repeated description regarding reference numerals that are the same as those of FIG. 3 may be omitted.

Referring to FIG. 8, a pixel array 110B may include a plurality of pixels NPXs, AFPX1B, and AFPX2B arranged in the first direction X and the second direction Y. The plurality of pixels NPXs, AFPX1B, and AFPX2B may include a plurality of normal pixels NPXs, and may include a first AF pixel AFPX1B and a second AF pixel AFPX2B, which are AF pixels AFPXs.

The first AF pixel AFPX1B and the second AF pixel AFPX2B may be adjacent to each other in the first direction X, or may be adjacent to each other in the second direction Y. The first AF pixel AFPX1B and the second AF pixel AFPX2B may share one AF microlens MLAF. That is, the one AF microlens MLAF may be formed on the first AF pixel AFPX1B and the second AF pixel AFPX2B.

Same color filters may be formed in the first AF pixel AFPX1B and the second AF pixel AFPX2B adjacent to each other. For example, white filters WFs may be formed in the first AF pixel AFPX1B and the second AF pixel AFPX2B.

Referring to FIG. 9, a pixel array 110C may include a plurality of pixels NPXs and AFPX1C through AFPX4C arranged in the first direction X and the second direction Y. The plurality of pixels NPXs and AFPX1C through AFPX4C may include a plurality of normal pixels NPXs, and may include a first AF pixel AFPX1C through a fourth AF pixel AFPX4C, which are AF pixels AFPXs.

The first AF pixel AFPX1C and the second AF pixel AFPX2C may be arranged in parallel in the first direction X, and the first AF pixel AFPX1C and the second AF pixel AFPX2C may share a first AF microlens MLAF1. That is, the one first AF microlens MLAF1 may be formed on the first AF pixel AFPX1C and the second AF pixel AFPX2C. The first AF microlens MLAF1 may refract light, which is incident on the pixel array 110C, to a photo-detecting area PDA of each of the first AF pixel AFPX1C and the second AF pixel AFPX2C.

The third AF pixel AFPX3C and the fourth AF pixel AFPX4C may be in parallel to each other in the first direction X, and may share a second AF microlens MLAF2. That is, one second AF microlens MLAF2 may be formed on the third AF pixel AFPX3C and the fourth AF pixel AFPX4C. The second AF microlens MLAF2 may refract light, which is incident on the pixel array 110C, to a photo-detecting area of each of the third AF pixel AFPX3C and the fourth AF pixel AFPX4C.

In embodiments, the first AF pixel AFPX1C may be adjacent to the third AF pixel AFPX3C, and the second AF pixel AFPX2C may be adjacent to the fourth AF pixel AFPX4C. For example, the first AF pixel AFPX1C and the third pixel AFPX3C may be adjacent to each other in the second direction Y, and the second AF pixel AFPX2C and the fourth pixel AFPX4C may be adjacent to each other in the second direction Y.

The first AF microlens MLAF1 and the second microlens MLAF2 may each have an ellipse shape in which a width in the first direction X is less than a width in the second direction Y. The image sensor may perform an AF function in the first direction X, by using phase signals output from the first AF pixel AFPX1C through the fourth AF pixel AFPX4C due to the shapes and refractive indices of the first AF microlens MLAF1 and the second AF microlens MLAF2.

In embodiments, first heights in the vertical direction of the first AF microlens MLAF1 and the second AF microlens MLAF2 may be greater than a second height of the normal microlens MLN. Accordingly, the first AF microlens MLAF1 and the second AF microlens MLAF2 may refract the incident light to the photo-detecting area of each of the first AF pixel AFPX1C through the fourth AFP pixel AFPX4C.

Same color filters may be formed in the first AF pixel AFPX1C and the second AF pixel AFPX2C adjacent to each other in the first direction X, and same color filters may be formed in the third AF pixel AFPX3C and the fourth AF pixel AFPX4C adjacent to each other in the first direction X. In embodiments, green filters GFs may be formed in the first pixel AFPX1C through the fourth AF pixel AFPX4C. Alternatively, for example, white filters may be formed in the first AF pixel AFPX1C through the fourth AF pixel AFPX4C. However, this is an example, and color filters formed in the first AF pixel AFPX1C through the fourth AF pixel AFPX4C may be variously changed.

For example, when the plurality of pixels NPXs and AFPX1C through AFPX4C are arranged in sixteen rows and sixteen columns in the pixel array 110C, a total of eight AF pixels AFPXS may be arranged. For example, when the plurality of pixels NPXs and AFPX1C through AFPXC4C are arranged in the pixel array 110C, each two of the first AF pixels AFPX1Cs through the fourth AF pixels AFPX4Cs may be arranged. However, this is an example, and a ratio of the AF pixel AFPXs included in the pixel array 110C may be variously configured.

Figure 10:
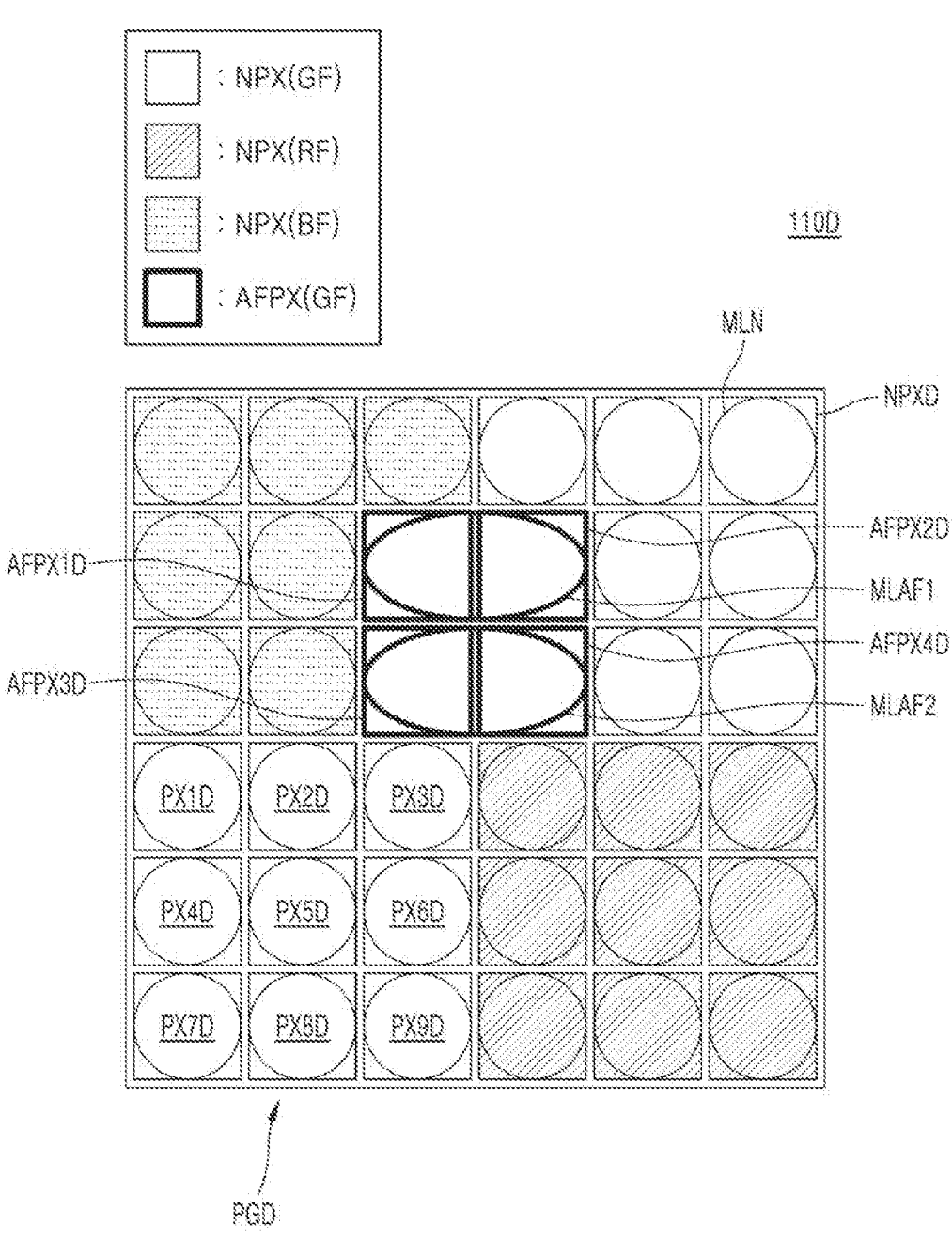
FIG. 10 is a plan view of a pixel array of the image sensor according to embodiments of the inventive concept.

FIG. 10 is a plan view of a pixel array 110D of the image sensor 100 according to embodiments of the inventive concept, as an example of at least a portion of the pixel array 110 shown in FIG. 2. In the descriptions regarding FIG. 10, repeated description regarding reference numerals that are the same as those of FIG. 3 may be omitted.

Referring to FIG. 10, the pixel array 110D may include a plurality of pixels NPXDs, AFPX1D through AFPX4D arranged in the first direction X and the second direction Y. The plurality of pixels NPXDs and AFPX1D through AFPX4D may include a plurality of normal pixels NPXDs, and may include a first AF pixel AFPX1D through a fourth AF pixel AFPX4D, which are AF pixels AFPXs.

The first AF pixel AFPX1D and the second AF pixel AFPX2D may be adjacent to each other in the first direction X, and the first AF pixel AFPX1D and the second AF pixel AFPX2D may share the first AF microlens MLAF1. The third AF pixel AFPX3D and the fourth AF pixel AFPX4D may be adjacent to each other in the first direction X, and the third AF pixel AFPX3D and the fourth pixel AFPX4D may share the second AF microlens MLAF2.

In embodiments, the first AF pixel AFPX1D may be adjacent to the third AF pixel AFPX3D, and the second AF pixel AFPX2D may be adjacent to the fourth pixel AFPX4D. For example, the first AF pixel AFPX1D and the third AF pixel AFPX3D may be adjacent to each other in the second direction Y, and the second AF pixel AFPX2D and the fourth pixel AFPX4D may be adjacent to each other in the second direction Y.

The first AF microlens MLAF1 and the second AF microlens MLAF2 may each have an ellipse shape in which a width in the first direction X is less than a width in the second direction Y. The image sensor may perform the AF function in the first direction X, by using phase signals output from the first AF pixel AFPX1D through the fourth AF pixel AFPX4D due to the shapes and refractive indices of the first AF microlens MLAF1 and the second AF microlens MLAF2.

In embodiments, first heights in the vertical direction of the first AF microlens MLAF1 and the second AF microlens MLAF2 may be greater than a second height in the vertical direction of the normal microlens MLN. Accordingly, the first AF microlens MLAF1 and the second AF microlens MLAF2 may refract the incident light to the photo-detecting area PDA of each of the first AF pixel AFPX1D through the fourth AF pixel AFPX4D.

Same color filters may be formed in the first AF pixel AFPX1D and the second AF pixel AFPX2D adjacent to each other in the first direction X, and same color filters may be formed in the third AF pixel AFPX3D and the fourth AF pixel AFPX4D adjacent to each other in the first direction X. In embodiments, green filters GFs may be formed in the first AF pixel AFPX1D through the fourth AF pixel AFPX4D.

Alternatively, for example, white filters may be formed in the first AF pixel AFPX1D through the fourth AF pixel AFPX4D. However, this is an example, and color filters formed in the first AF pixel AFPX1C through the fourth AF pixel AFPX4D may be variously modified.

In embodiments, when the plurality of pixels NPXDs, AFPX1D through AFPX4D are arranged in twelve rows and twelve columns, the AF pixels AFPXs may be arranged in a total number of four. For example, when the plurality of pixels NPXDs, AFPX1D through AFPX4D are arranged in the pixel array 110C in twelve rows and twelve columns, each of the first AF pixel AFPX1D through the fourth AF pixel AFPX4D may be arranged in the number of one. However, this is an example, and a rate of the AF pixels AFPXs included in the pixel array 110C may be variously configured.

The normal pixels NPXDs arranged in three columns and three columns adjacent to one another, in which same color filters are formed, may construct one pixel group PG. For example, a first pixel PX1D through a ninth pixel PX9D constructing one pixel group PGD are arranged to one another in three rows and three columns, and same green filters GFs may be formed therein. However, this is embodiments, and the normal pixels NPXD constructing the one pixel group PGD may be variously arranged, and one corresponding color filter among the green filter GF, the red filter RF, and the blue filter BF may be arranged therein.

In embodiments, each of the pixel groups PGDs may be arranged in the pixel array 110D to correspond to a Bayer pattern, and may include, for example, a corresponding color filter among the green filter GF, the red filter RF, and the blue filter BF. However, this is embodiments, and the pixel array 110D according to embodiments of the inventive concept may include various kinds of color filters.

In embodiments, the normal pixels NPXDs included in one pixel group PGD may share a floating diffusion area (e.g., the floating diffusion area FD in FIG. 6), and may also share a selection transistor (e.g., the selection transistor SX in FIG. 6), a source follower (e.g., the source follower SF in FIG. 6), and the reset transistor (e.g., the reset transistor RX in FIG. 6). Alternatively, in embodiments, the normal pixels NPXDs included in one pixel group PGD may not share the floating diffusion area FD and individually include separate floating diffusion areas FDs, respectively.

Figure 11:
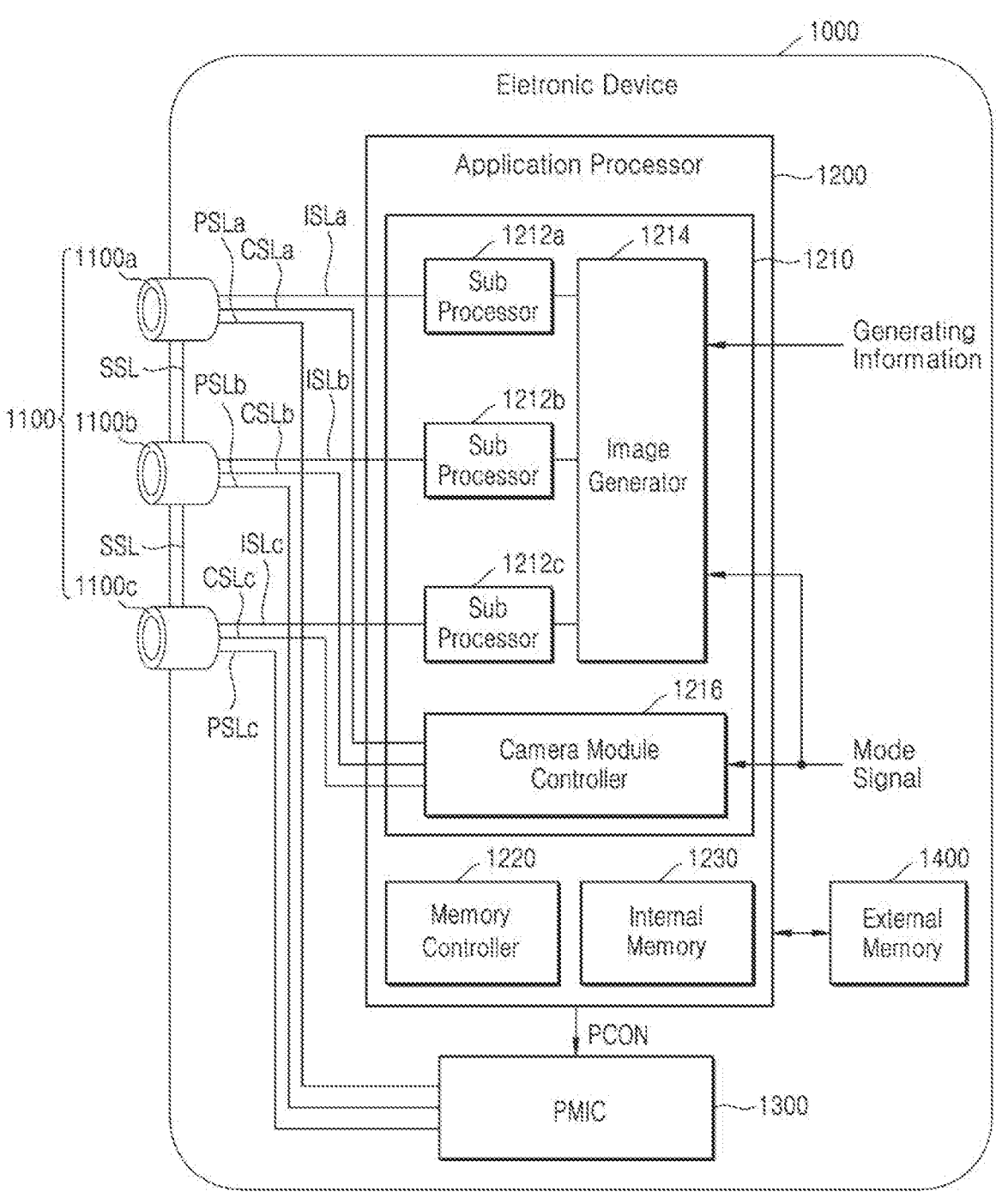
FIG. 11 is a block diagram of an electronic device including a multi camera module.
Figure 12:
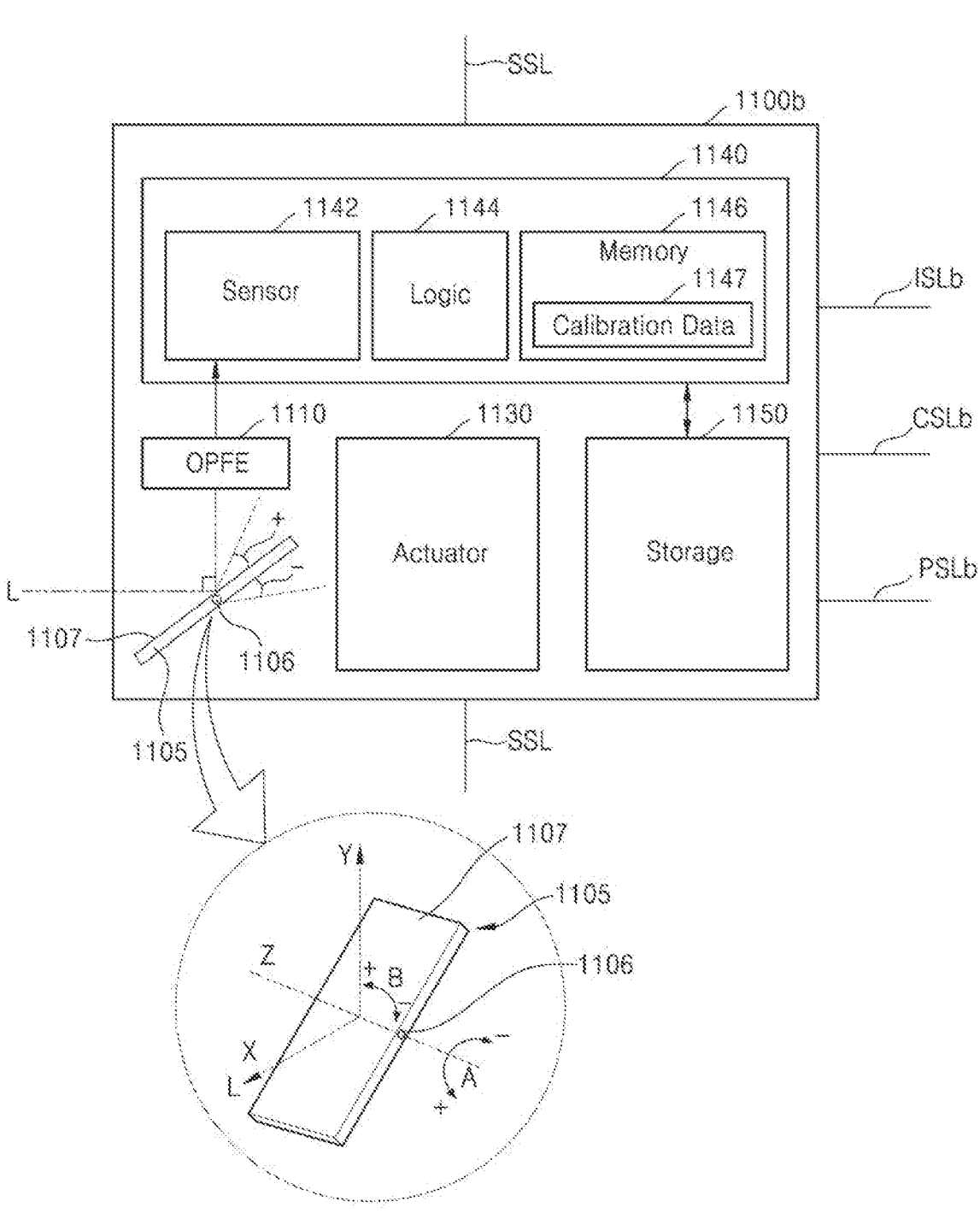
FIG. 12 is a detailed block diagram of the camera module shown in FIG. 11.

FIG. 11 is a block diagram of an electronic device 1000 including a multi camera module. FIG. 12 is a detailed block diagram of the camera module shown in FIG. 11. Although a detailed configuration of a camera module 1100b is described in FIG. 2, according to embodiments, the following descriptions may also be applied to other camera modules 1100a and 1100c.

Referring to FIG. 11, the electronic device 1000 may include a camera module group 1100, an application processor, a power management integrated circuit (PMIC) 1300, and an external memory 1400. The camera module group 1100 may include a plurality of camera modules 1100a, 1100b, and 1100c. Although FIG. 11 shows embodiments in which three camera modules 1100a, 1100b, and 1100c are arranged, but the embodiments are not limited thereto.

Referring to FIGS. 11 and 12, the camera module 1100b may include a prism 1105, an optical path folding element (hereinafter, referred to as "OPFE") 1110, an actuator 1130, an image sensing device 1140, and a storage 1150.

The prism 1105, which includes a reflecting plane 1107 formed of a light-reflecting material, may change a path of light L incident from outside. The OPFE 1110 may 1110 may include, for example, optical lenses constructed in m (where m is a natural number) groups. The actuator 1130 may shift the OPFE 1110 or the optical lenses (hereinafter, referred to as optical lenses) to a position.

The image sensing device 1140 may include an image sensor 1142, a control logic 1144, and a memory 1146. The image sensor 1142 may sense an image of a sensing object by using the light L provided through the optical lenses. The image sensor 1142 may be the image sensor 100 described with reference to FIGS. 1 and 2, and may include the pixel arrays 110, 110A, 110B, 110C, and 110D described with reference to FIGS. 3 through 10.

The control logic 1144 may control all operations of the camera module 1100b. For example, the control logic 1144 may control operations of the camera module 1100b in response to a control signal provided through a control signal line CSLb.

In embodiments, a camera module (e.g., the camera module 1100b) among the plurality of camera modules 1100a, 1100b, and 1100c may be a camera module having a folded lens shape, which includes the prism 1105 and the OPFE 1110 described above, and the other camera modules (e.g., the camera modules 1100a and 1100c) may be camera modules having a vertical shape, in which the prism 1105 and the OPFE 1110 are not included, but the embodiments are not limited thereto.

In embodiments, a camera module (e.g., the camera module 1100c) among the plurality of camera modules 1100a, 1100b, and 1100c may include, for example, a depth camera having a vertical depth, which extracts depth information by using an infrared ray (IR). In this case, the application processor 1200 may generate a three-dimensional (3D) image depth by merging an image data value provided from the depth camera and an image data value provided from another camera module (e.g., the camera module 1100a or 1100b).

In embodiments, at least two camera modules (e.g., the camera modules 1100a and 1100b) among the plurality of camera modules 1100a, 1100b, and 1100c may have different fields of view. In this case, optical lenses of the at least two camera modules (e.g., the camera modules 1100a and 1100b) among the plurality of camera modules 1100a, 1100b, and 1100c may be different from one another, but the embodiment is not limited thereto.

Furthermore, in embodiments, fields of view of the plurality of camera modules 1100a, 1100b, and 1100c may be different from one another. In this case, optical lenses respectively included in the plurality of camera modules 1100a, 1100b, and 1100c may be different from one another, but the embodiment is not limited thereto.

In embodiments, the plurality of camera modules 1100a, 1100b, and 1100c may be physically separated from one another. That is, a sensing area of one image sensor 1142 is not used in division by the plurality of camera modules 1100a, 1100b, and 1100c, and the image sensor 1142 may be individually arranged in each of the plurality of camera modules 1100a, 1100b, and 1100c.

Referring again to FIG. 11, the application processor 1200 may include an image processing device 1210, a memory controller 1220, and an internal memory 1230. The application processor 1200 may be implemented in separation from the plurality of camera modules 1100a, 1100b, and 1100c. For example, the application processor 1200 and the plurality of camera modules 1100a, 1100b, and 1100c may be implemented in separation from each other as separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c in a number corresponding to the number of the plurality of camera modules 1100a, 1100b, and 1100c.

Image data values respectively generated by the camera modules 1100a, 1100b, and 1100c may be provided to corresponding sub image processors 1212a, 1212b, and 1212c through image signal lines ISLa, ISLb, and ISLc that are separated from one another. For example, the image data value provided by the camera module 1100a may be provided to the sub image processor 1212a through the image signal line ISLa, the image data value provided by the camera module 1100b may be provided to the sub image processor 1212b through the image signal line ISLb, and the image data value provided by the camera module 1100b may be provided to the sub image processor 1212c through the image signal line ISLc. Transmission of the image data values may be performed, for example, by using a mobile industry processor interface (MIPI)-based camera serial interface (CSI), but embodiments are not limited thereto.

The image data values provided to the sub image processors 1212a, 1212b, and 1212c may be provided to the image generator 1214. The image generator 1214 may generate an output image by using image data provided by each of the sub image processors 1212a, 1212b, and 1212c according to image generating information or a mode signal.

In detail, the image generator 1214 may generate the output image by merging at least some of the image data values, which are generated from the camera modules 1100a, 1100b, and 1100c having different fields of view, according to the image generating information or the mode signal. In addition, the image generator 1214 may generate the output image by selecting any one of the image data values, which are generated from the camera modules 1100a, 1100b, and 1100c having different fields of view, according to the image generating information or the mode signal.

The camera module controller 1216 may provide a control signal to each of the camera module 1100a, 1100b, and 1100c. The control signals generated by the camera module controller 1216 may be provided to corresponding camera modules 1100a, 1100b, and 1100c through the control signal lines CSLa, CSLb, and CSLc that are separated from one another.

The application processor 1200 may store the received image data values (i.e., encoded data) in the internal memory 1230 or the external memory 1400 outside the application processor 1200, and then, may read and decode the encoded data from the internal memory 1230 or the external memory 1400 and display an image that is generated based on the decoded image values. For example, corresponding sub processors among the plurality of sub image processors 1212a, 1212b, and 1212c of the image processing device 1210 may perform decoding, and may also perform decoding with respect to the decoded image values.

The PMIC 1300 may provide power (e.g., the power voltage) to each of the plurality of camera modules 1100a, 1100b, and 1100c. For example, under control of the application processor 1200, the PMIC 1300 may provide a first power to the camera module 1100a through the power signal line PSLa, provide a second power to the camera module 1100b through the power signal line PSLb, and provide a third power to the camera module 1100c through the power signal line PSLc.

While the inventive concept has been shown and described with reference to embodiments thereof, it will be understood that various changes in form and details may be made therein without departing from the spirit and scope of the following claims.

What is claimed is:

1. A method of manufacturing an image sensor, comprising:

arranging a plurality of photo-detecting areas corresponding to each of a plurality of pixels including a normal pixel, a first auto-focus (AF) pixel, and a second AF pixel on a first surface of a semiconductor substrate;

disposing an insulating layer and color filters on a second surface of the semiconductor substrate;

disposing a lens layer on the color filters, the lens layer having a lower surface facing the color filters and an upper surface opposite the lower surface, and the lens layer being continuously formed of a same material from the lower surface to the upper surface;

disposing a first photoresist film on the upper surface of the lens layer;

performing a first etching process on the lens layer and a first dummy lens to form a first micro lens pattern in the lens layer, the first dummy lens being formed based on the first photoresist film, the first micro lens pattern having a first etched upper surface opposite the lower surface of the lens layer, and the same material being continuously formed from the lower surface to the first etched upper surface;

disposing a second photoresist film on the first etched upper surface of the first micro lens pattern; and performing a second etching process on the first micro lens pattern and a second dummy lens to form a micro lens, the second dummy lens being formed based on the second photo resist film, the micro lens having a second etched upper surface opposite the lower surface of the lens layer, and the same material being continuously formed from the lower surface to the second etched upper surface.

2. The method of claim 1, wherein the arranging the plurality of photo-detecting areas comprises:

forming a deep trench isolation portion to isolate the plurality of photo-detecting areas from each other.

3. The method of claim 2, wherein the deep trench isolation portion is formed to extend from the first surface to the second surface.

4. The method of claim 3, wherein a width of the deep trench isolation portion formed on the first surface is greater than a width of the deep trench isolation portion formed on the second surface.

5. The method of claim 2, wherein the forming the deep trench isolation portion comprises:

constructing the deep trench isolation portion with an insulating material having a lower refractive index than the semiconductor substrate.

6. The method of claim 1, wherein the disposing the first photoresist film comprises:

disposing the first photoresist film such that a common pattern is formed on the first AF pixel and the second AF pixel.

7. The method of claim 6, wherein the second photoresist film is formed on the first AF pixel and the second AF pixel, and not on the normal pixel.

8. The method of claim 6, wherein a height of the micro lens formed corresponding to the first AF pixel and the second AF pixel is greater than a height of the micro lens formed corresponding to the normal pixel.

9. The method of claim 1, wherein the forming the first micro lens pattern comprises:

forming the first dummy lens by performing a reflow process on the first photoresist film, wherein the first dummy lens is formed in a convex hemisphere shape.

10. The method of claim 1, wherein the forming the micro lens comprises:

forming the second dummy lens by performing a reflow process on the second photoresist film, and wherein the second dummy lens is formed in a convex hemisphere shape.

11. The method of claim 1, wherein each of patterns of the first photoresist film is formed to have a constant distance from each other.

12. The method of claim 1, wherein the first etching process and the second etching process are wet etching processes using the first dummy lens and the second dummy lens as an etch mask, respectively.

13. The method of claim 1, further comprising depositing a protective film on the micro lens.

14. The method of claim 1, wherein a same color filter is disposed on the first AF pixel and the second AF pixel.

15. The method of claim 1, wherein the first surface is a bottom surface of the semiconductor substrate, the second surface is a top surface of the semiconductor substrate.

16. A method of manufacturing an image sensor, comprising:

arranging a plurality of photo-detecting areas corresponding to each of a plurality of pixels including a normal pixel, a first auto-focus (AF) pixel, and a second AF pixel on a bottom surface of a semiconductor substrate;

disposing a lens layer on a top surface of the semiconductor substrate, the lens layer having a lower surface facing the semiconductor substrate and an upper surface opposite the lower surface, and the lens layer being continuously formed of a same material from the lower surface to the upper surface;

disposing a first photoresist film on the upper surface of the lens layer such that a common pattern is formed on the first AF pixel and the second AF pixel;

forming a first dummy lens by processing the first photoresist film;

forming a first micro lens pattern in the lens layer by etching the lens layer and the first dummy lens, the first micro lens pattern having a first etched upper surface opposite the lower surface of the lens layer, and the same material being continuously formed from the lower surface to the first etched upper surface;

disposing a second photoresist film on the first etched upper surface of the first micro lens pattern;

forming a second dummy lens by processing the second photoresist film; and forming a micro lens by etching the first micro lens pattern and the second dummy lens, the micro lens having a second etched upper surface opposite the lower surface of the lens layer, and the same material being continuously formed from the lower surface to the second etched upper surface.

17. The method of claim 16, wherein the arranging the plurality of photo-detecting areas comprises:

forming a deep trench isolation portion to isolate the plurality of photo-detecting areas from each other.

18. The method of claim 16, wherein the second photoresist film is formed on the first AF pixel and the second AF pixel, and not on the normal pixel.

19. A method of manufacturing an image sensor, comprising:

arranging a plurality of photo-detecting areas corresponding to each of a plurality of pixels including a normal pixel, a first auto-focus (AF) pixel, and a second AF pixel, and isolated from each other by a deep trench isolation portion;

disposing an insulating layer and a plurality of color filters on the plurality of photo-detecting areas;

disposing a lens layer on the plurality of color filters, the lens layer having a lower surface facing the plurality of color filters and an upper surface opposite the lower surface, and the lens layer being continuously formed of a same material from the lower surface to the upper surface;

disposing a first photoresist film on the upper surface of the lens layer;

forming a first dummy lens by processing the first photoresist film;

forming a first micro lens pattern by etching the lens layer and the first dummy lens, the first micro lens pattern having a first etched upper surface opposite the lower surface of the lens layer, and the same material being continuously formed from the lower surface to the first etched upper surface;

disposing a second photoresist film corresponding to the first AF pixel and the second AF pixel on the first etched upper surface of the first micro lens pattern;

forming a second dummy lens by processing the second photoresist film; and forming a micro lens by etching the first micro lens pattern and the second dummy lens, the micro lens having a second etched upper surface opposite the lower surface of the lens layer, and the same material being continuously formed from the lower surface to the second etched upper surface.

20. The method of claim 19, wherein the disposing the first photoresist film comprises:

disposing the first photoresist film such that a common pattern is formed on the first AF pixel and the second AF pixel, and is offset from the normal pixel.

* * * * *